US006604229B2

United States Patent
Suzuki et al.

(10) Patent No.: US 6,604,229 B2
(45) Date of Patent: Aug. 5, 2003

(54) METHOD OF DESIGNING WIRING FOR POWER SOURCES IN A SEMICONDUCTOR CHIP, AND A COMPUTER PRODUCT

(75) Inventors: Kenji Suzuki, Kawaski (JP); Koji Banno, Kawasaki (JP); Toru Osajima, Kawasaki (JP); Takashi Yoneda, Kasugai (JP); Takanori Nawa, Kasugai (JP); Koji Tsuneto, Kasugai (JP); Masuo Inui, Kasugai (JP); Hiroyuki Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/812,552

(22) Filed: Mar. 21, 2001

(65) Prior Publication Data

US 2002/0032897 A1 Mar. 14, 2002

(30) Foreign Application Priority Data

Jul. 26, 2000 (JP) ......................................... 2000-225600

(51) Int. Cl.[7] .............................................. G06F 17/50
(52) U.S. Cl. ................................ 716/13; 716/2; 716/10
(58) Field of Search ................................ 716/1–3, 5, 7, 716/9, 10, 11, 13; 438/128, 129; 257/202

(56) References Cited

U.S. PATENT DOCUMENTS 5,537,328 A * 7/1996 Ito ............................. 257/202
5,824,570 A * 10/1998 Aoki et al. ................. 438/128

FOREIGN PATENT DOCUMENTS

JP 10-135339 5/1998

\* cited by examiner

*Primary Examiner*—Minh Nguyen
(74) *Attorney, Agent, or Firm*—Staas & Halsey LLP

(57) ABSTRACT

In a higher layer, power source wiring is provisionally provided between a logic-decided functional block and the logic-undecided functional block. Then, a resistor network of the power source wiring within the logic-undecided functional block is prepared by assuming that a current source has been connected to a power source terminal of the logic-undecided functional block. A resistor network of a total power source wiring in the higher layer is prepared by using this local resistor network. An optimum width of the power source wiring is determined by analyzing this resistor network. Based on the width, the power source wiring of the higher layer is rewired.

36 Claims, 27 Drawing Sheets

FIG.3

- ESTIMATED AREA

- ESTIMATED POWER CONSUMPTION

- OPERATION VOLTAGE USED

LOGIC-UNDECIDED
BLOCK

PITCHES OF POWER SOURCE
TERMINAL POSITION AS A BASIS

NUMBER OF POWER SOURCE
TERMINALS, AND POWER
SOURCE TERMINAL POSITIONS

OBTAINED POWER SOURCE
WIRING WIDTH WITHIN LOGIC-
UNDECIDED FUNCTIONAL BLOCK

POWER SOURCE
WIDTH AS A BASIS

OBTAINED NUMBER OF
POWER SOURCE TERMINALS

POSSIBLE TO ADD
POWER SOURCE
WIRING

POWER SOURCE WIRING CAN BE MOVED IN A DIRECTION FROM
THE BROKEN LINE TO THE SOLID LINE

METHOD OF DESIGNING WIRING FOR POWER SOURCES IN A SEMICONDUCTOR CHIP, AND A COMPUTER PRODUCT

FIELD OF THE INVENTION

The present invention in general relates to a method of designing wiring for power sources in a semiconductor chip, and a computer-readable recording medium recorded with a program for making a computer execute this method. More particularly, this invention relates to a method of designing wiring for power sources of installing a plurality of functional blocks including logic-decided functional blocks and logic-undecided functional blocks on a semiconductor chip and wiring the power sources of these functional blocks.

BACKGROUND OF THE INVENTION

A logic-undecided functional block means a functional block that has no logic at all or that has only a part of logic decided. A logic-decided functional block means a functional logic that has all the logic decided. In the present specification, power source wiring also includes a ground wiring in addition to the power source wiring for supplying voltages.

Conventionally, in designing a layout of a semiconductor chip, a floor plan and power source wiring have been designed in the following method when there is a hierarchy in logic-decided functional blocks and logic-undecided functional blocks. First, a rough number of logic gates to be used, a gate utilization rate and power consumption for the hierarchy of the logic-decided functional blocks and logic-undecided functional blocks are obtained by calculation. Based on a result of this calculation, a size of a logic-undecided area is determined. Using this size, a size of an LSI chip is estimated. Then, after a list of all logic net has been prepared, functional blocks are actually installed based on a floor plan. Thereafter, wiring is designed, and a resistor network of the power source wiring is analyzed. When there is shortage in the power supply as a result of the analysis, another floor plan is prepared again from the start. Then, a power source designing, installation and wiring are carried out.

According to the conventional layout designing method, has a disadvantage that it requires a long design process as it is necessary to carry out the floor planning, installation and wiring from the start again when there is shortage in the power supply in the first plan. Further, there is a problem in that the size of logic-undecided area becomes large due to the addition of power sources, which results in an increase in chip size. Further, there is a problem that it is not possible to find a surplus position in the initial estimate.

SUMMARY OF THE INVENTION

It is an object of the present invention to provide a method of designing wiring for power sources in a semiconductor chip capable of installing logic-decided functional blocks and logic-undecided functional blocks together on a semiconductor chip when there are logic-undecided functional blocks, and designing an optimum power source wiring for these functional blocks. It is another object of this invention to provide a computer readable recording medium that stores a computer program which when executed realizes the method according to the present invention.

According to one aspect of the present invention, a width of the power source wiring necessary within a logic-undecided functional block is estimated based on the power consumption information of the logic-undecided functional block. It is possible to determine an area of the logic-undecided functional block using this estimate. In the higher layer, the power source wiring is provisionally provided between a logic-decided functional block and the logic-undecided functional block. By analyzing the resistor network of this provisional wiring, it is possible to estimate an optimum width of the power source wiring. Therefore, even when an actual designing of the power source wiring within the logic-undecided functional block of which logic has been decided is carried out once after the designing of the power source wiring in the higher layer has been finished, the actual width of the power source wiring within the logic-undecided functional block becomes equal to or smaller than the width estimated earlier. Further, the actual width of the power source wiring in the higher layer also becomes equal to or smaller than the width estimated earlier.

Other objects and features of this invention will become apparent from the following description with reference to the accompanying drawings.

BRIEF DESCRIPTION OF THE DRAWINGS

FIG. 3 is a diagram showing one example of information necessary for determining an area of a logic-undecided functional block in the implementation of a method of designing wiring for power sources relating to the present invention.

DESCRIPTION OF THE PREFERRED EMBODIMENTS

Preferred embodiments of the present invention will be explained in detail with reference to the drawings.

Figure 1:
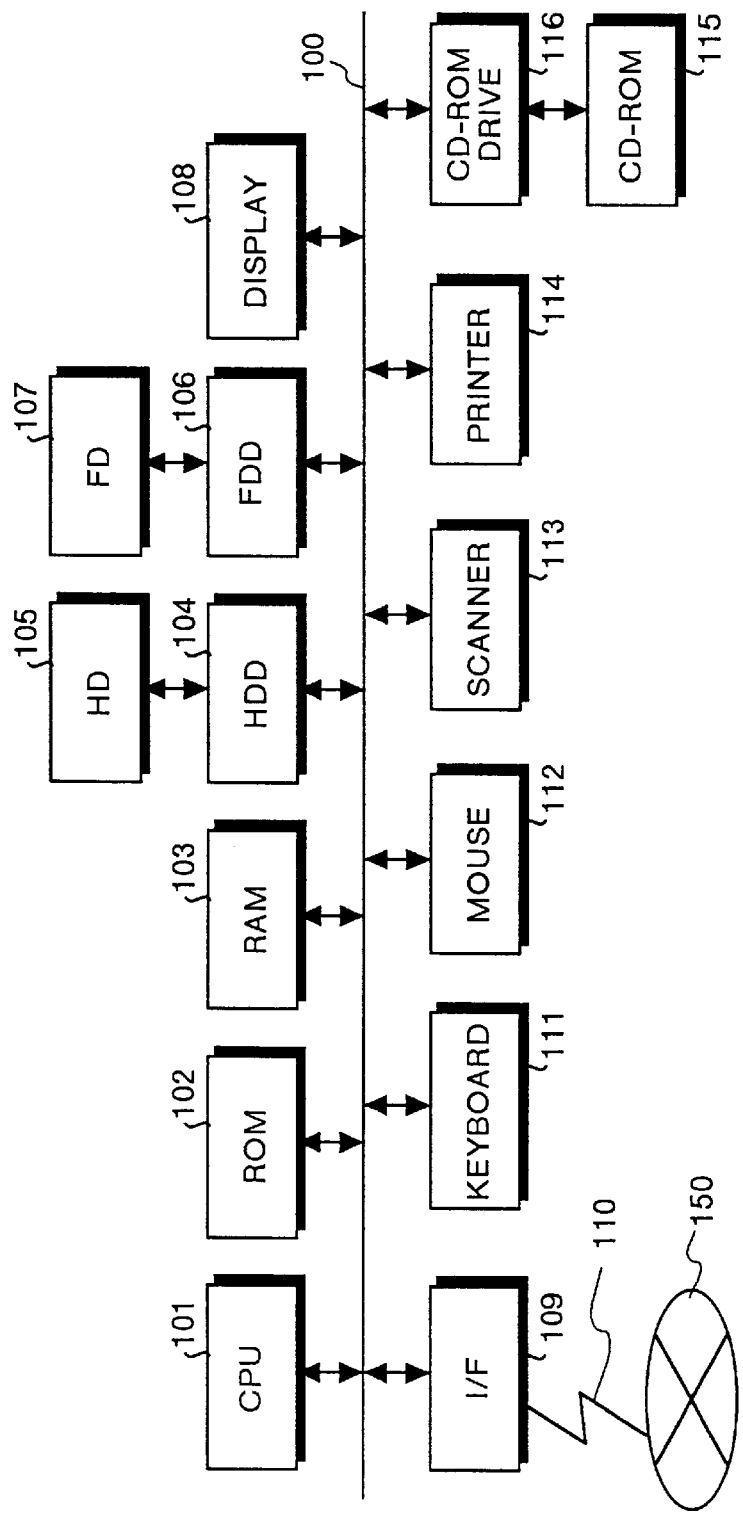
FIG. 1 is a block diagram showing a hardware configuration of a layout designing apparatus to be used for the implementation of a method of designing wiring for power sources relating to the present invention.

FIG. 1 is a block diagram showing a hardware configuration of a layout designing apparatus to be used for the implementation of a method of designing wiring for power sources relating to the present invention. This layout designing apparatus has a central processing unit (CPU) 101, a read-only memory (ROM) 102, a random-access memory (RAM) 103, a hard disk drive (HDD) 104, a floppy disk drive (FDD) 106, a display 108, a communication interface (I/F) 109, a keyboard 111, a mouse and the like (including various pointing devices) 112, a scanner 113, a printer 114, and a compact-disk read-only memory drive (CD-ROM drive) 116, mutually connected with each other via a bus 100 respectively.

A program for making a computer execute a method of designing wiring for power sources relating to the present invention is recorded in a floppy disk (FD) 107 or a compact-disk read-only memory (CD-ROM) 115. The program recorded in the FD 107 or the CD-ROM 115 is stored in a hard disk (HD) 105, for example. This program is then expanded in the RAM 103, and is executed.

The CPU 101 carries out a control of the apparatus as a whole. The ROM 102 stores a boot program and the like. The RAM 103 is used as a work area for the CPU 101. The HDD 104 controls the writing and reading of data into and from the HD 105 based on the control of the CPU 101. The FDD 106 controls the writing and reading of data into and from the FD 107 as a detachable recording medium based on the control of the CPU 101.

The display 108 displays a cursor, icons, tool boxes, and windows (browsers) relating to data such as documents, images, functional information, etc. The communication interface (I/F) 109 is connected to a network 150 via a wire or radio communication line 110, and takes an interface with the network 150. The keyboard 111 has a plurality of keys for inputting characters, numerical values, and various instructions.

The mouse 112 is used for moving the cursor, selecting a range, moving a window, changing a size of a window, selecting an icon, moving an icon, etc. The scanner 113 is a device for optically reading an image. The printer 114 prints contents displayed on a window. The CD-ROM drive 116 controls the reading of data from the CD-ROM 115 as a detachable recording medium.

Figure 2:
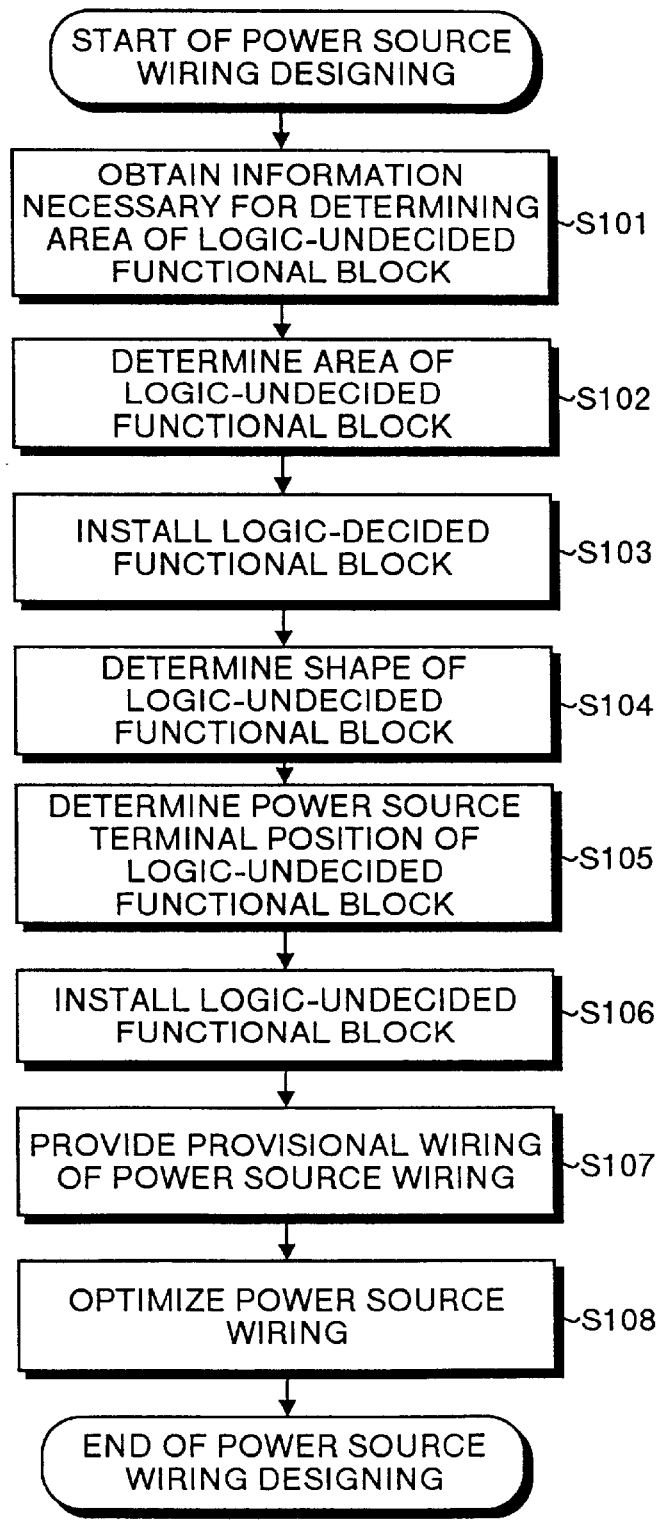
FIG. 2 is a flowchart showing one example of a method of designing wiring for power sources relating to the present invention.

FIG. 2 is a flowchart showing the method of designing wiring for power sources relating to a first embodiment of the present invention. When the designing of power source wiring for a semiconductor chip has been started, information necessary for determining an area of a logic-undecided functional block is first obtained, when there is a logic-undecided functional block (step S101). This information includes, for example, an estimated area of a cell, estimated power consumption, and operation voltage that are used in the logic-undecided functional block (refer to FIG. 3).

Based on the information obtained at step S101, an area of the logic-undecided functional block is determined (step S102). An area S is obtained from the following expression.

$$S = N \times s/\alpha + W$$

where W represents a width of power source wiring necessary within the logic-undecided functional block, N represents a number of gates to be used within the logic-undecided functional block, s represents an area occupied by one gate, and α represents a gate using rate within the logic-undecided functional block.

The number of gates N to be used within the logic-undecided functional block and the gate using rate α within the logic-undecided functional block are specified by a user. The width of power source wiring W necessary within the logic-undecided functional block can be obtained based on the power consumption information of the logic-undecided functional block. This power consumption information is obtained from items of operation frequency, operation rate, power supply voltage used, a number of gates, environmental temperature, and current density of the logic-undecided functional block respectively.

Figure 4:
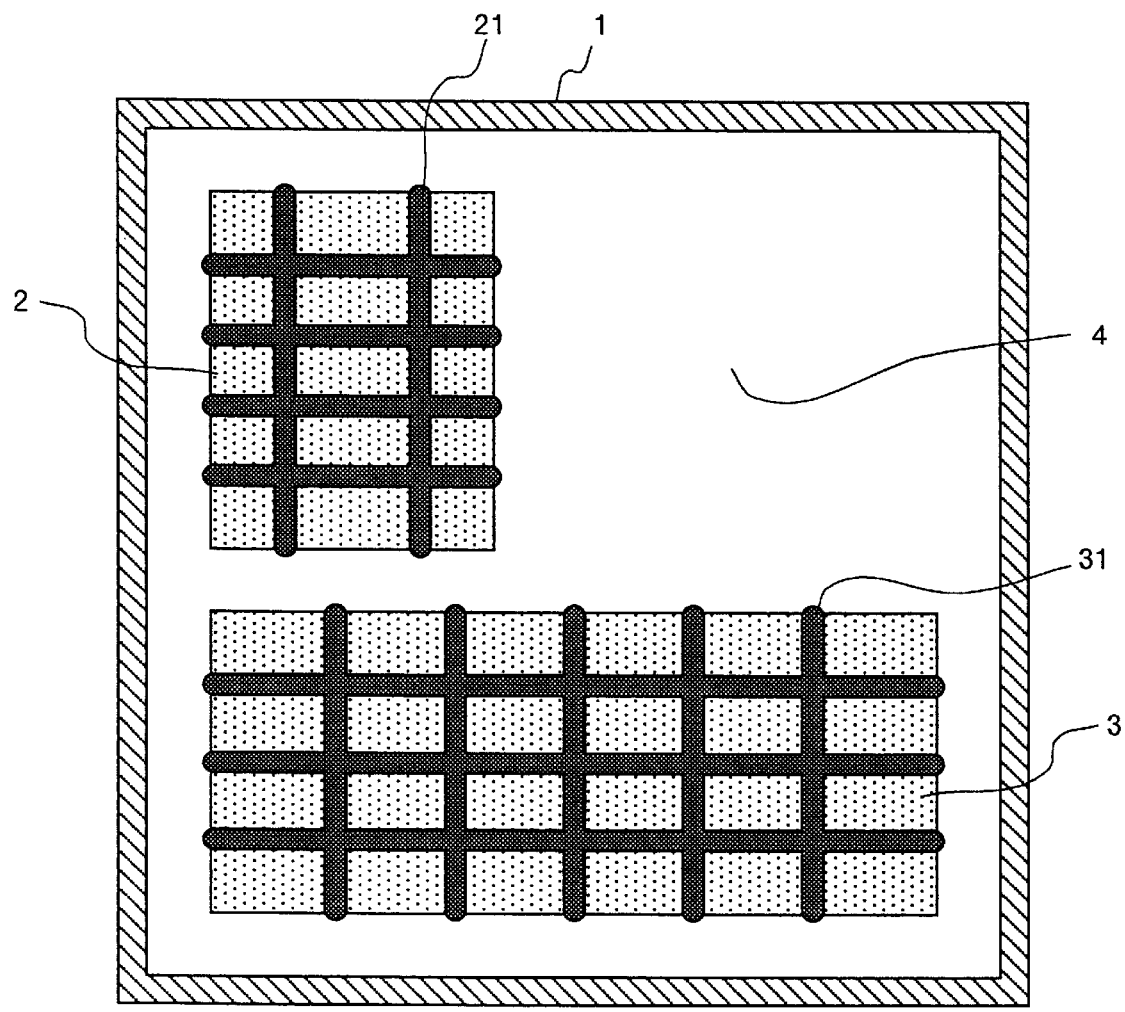
FIG. 4 is a diagram showing one example of a state that a logic-decided functional block has been installed on a semiconductor chip in the implementation of a method of designing wiring for power sources relating to the present invention.
Figure 5:
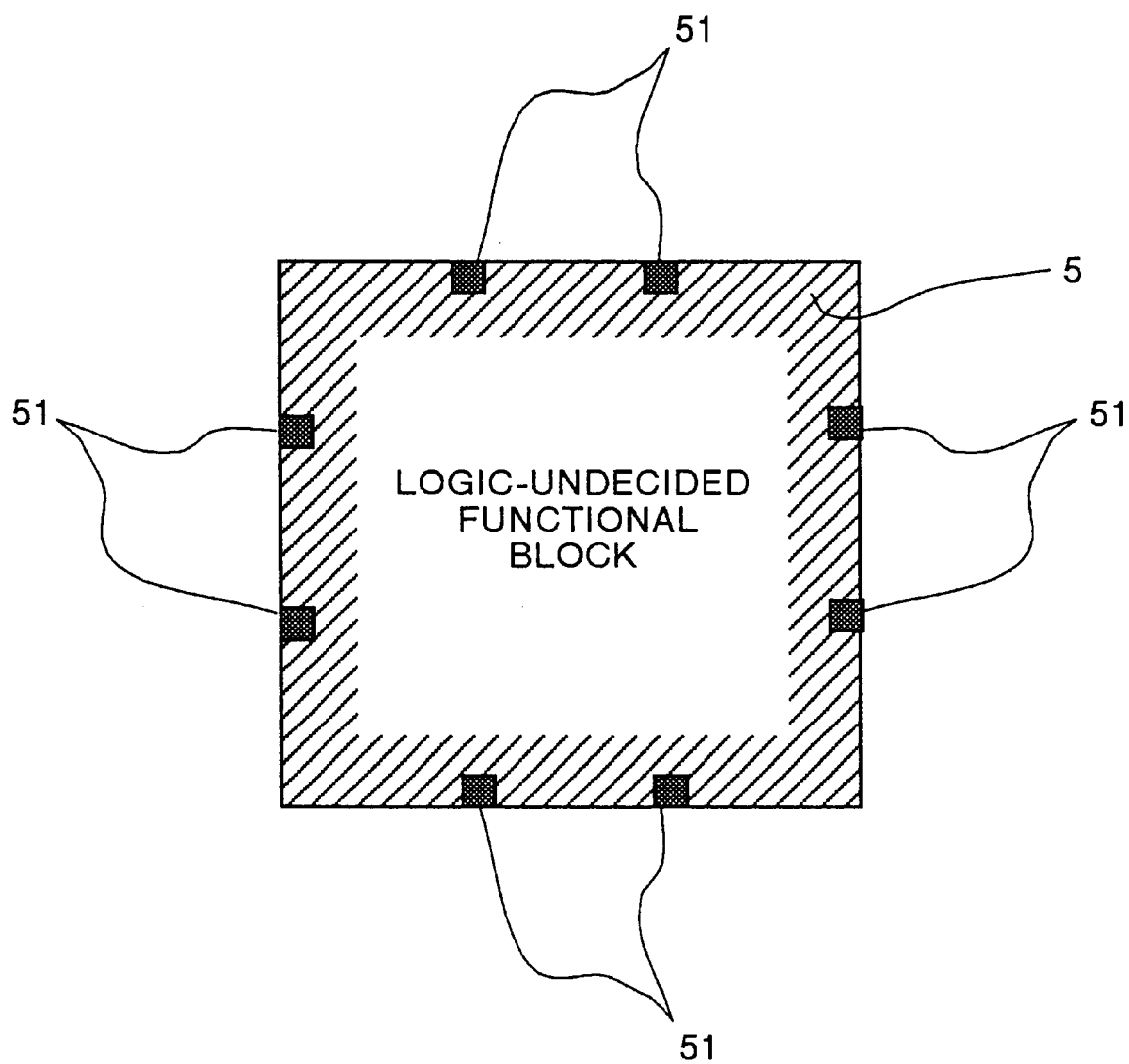
FIG. 5 is a diagram showing one example of a logic-undecided functional block of which shape and a power source terminal position have been determined in the implementation of a method of designing wiring for power sources relating to the present invention.

Next, the logic-undecided functional block is installed on the semiconductor chip (step S103). This state is shown in FIG. 4. In FIG. 4, a reference number 1 denotes a semiconductor chip, reference numbers 2 and 3 denote logic-decided functional blocks, and reference numbers 21 and 31 denote power source wiring within the logic-decided functional blocks respectively. Referring back to FIG. 2, a shape of the logic-undecided functional block is determined to match a space area (as denoted by a reference number 4 in FIG. 4) in which no logic-decided functional block is installed on the semiconductor chip (step S104). Further, a power source terminal position for the logic-undecided functional block is determined (step S105). A method of determining a power source terminal position for the logic-undecided functional block will be explained later. FIG. 5 is a diagram showing one example of a logic-undecided functional block of which shape and a power source terminal position have been determined. A reference number 5 denotes a logic-undecided functional block, and 51 denotes a power source terminal.

Figure 6:
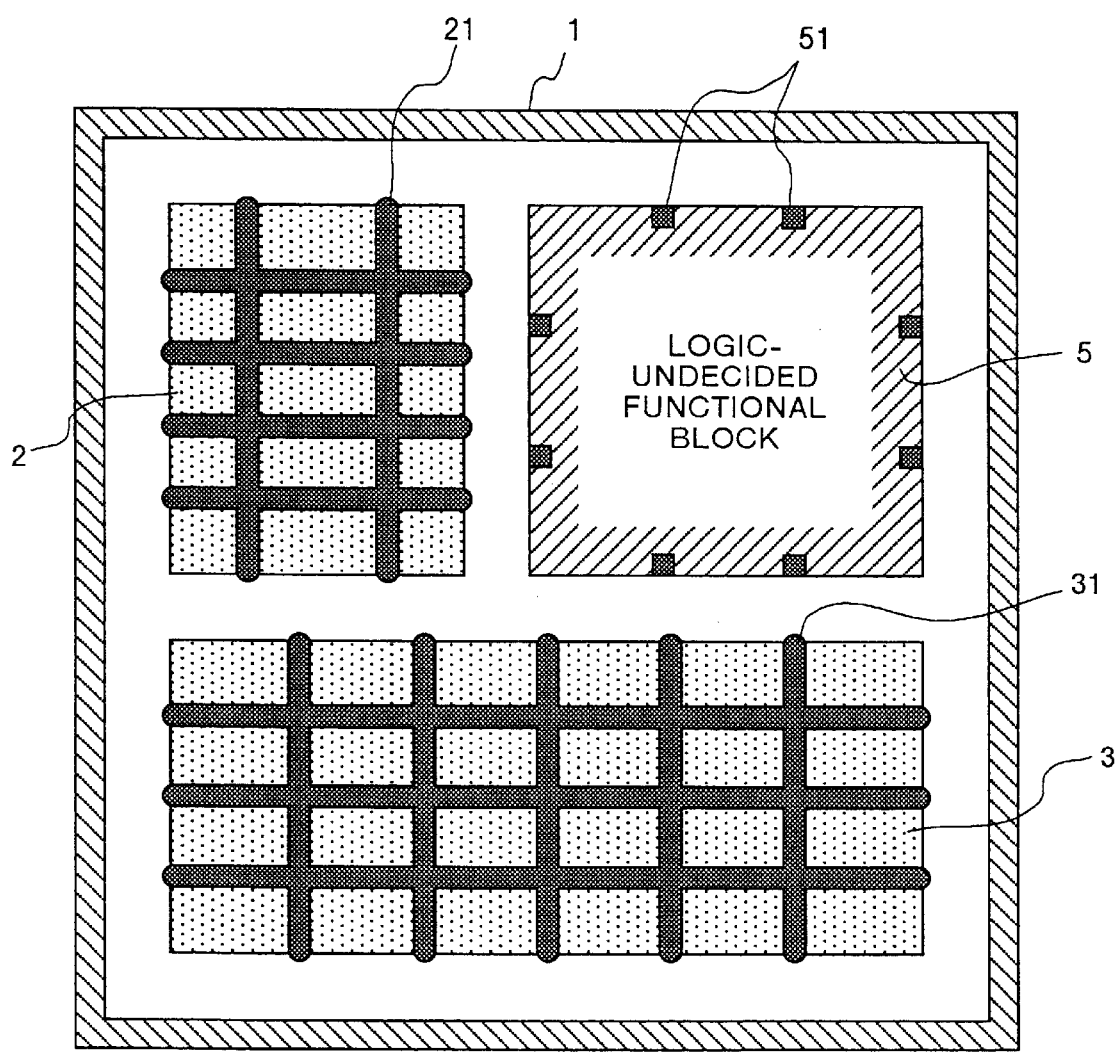
FIG. 6 is a diagram showing one example of a state that a logic-decided functional block and a logic-undecided functional block have been installed on a semiconductor chip in the implementation of a method of designing wiring for power sources relating to the present invention.
Figure 7:
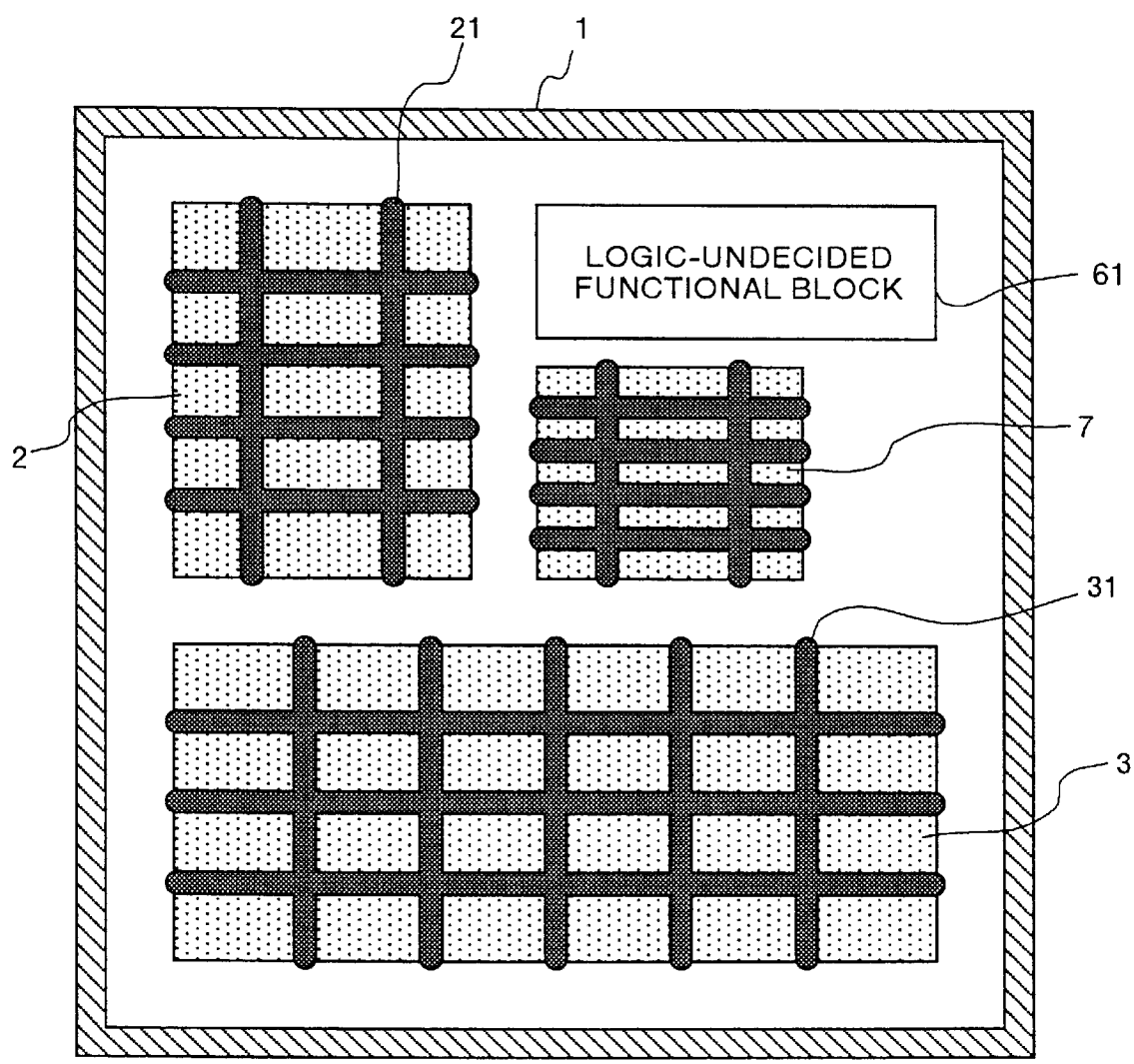
FIG. 7 is a diagram showing another example of a state that a logic-decided functional block and a logic-undecided functional block have been installed on a semiconductor chip in the implementation of a method of designing wiring for power sources relating to the present invention.
Figure 8:
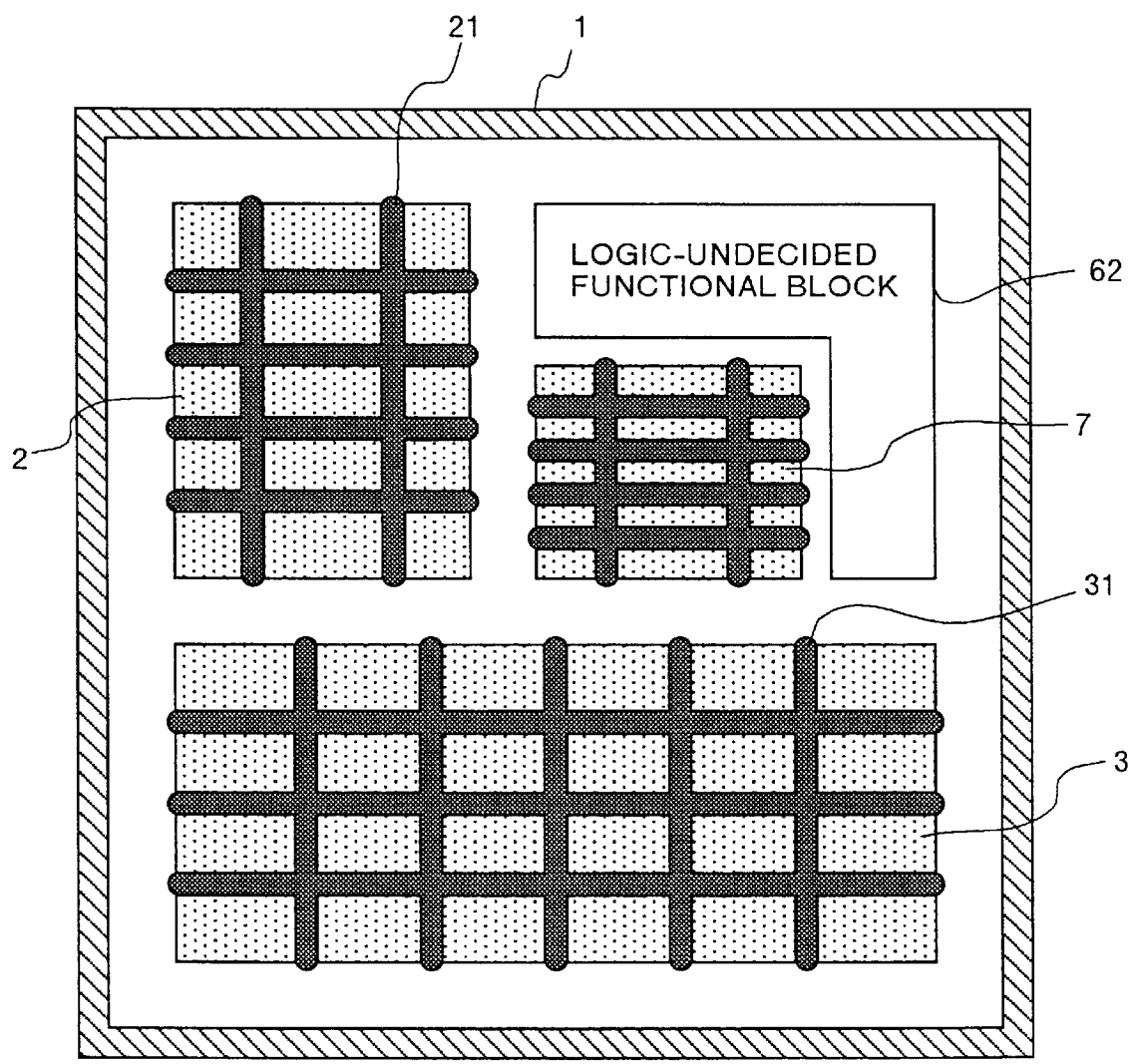
FIG. 8 is a diagram showing still another example of a state that a logic-decided functional block and a logic-undecided functional block have been installed on a semiconductor chip in the implementation of a method of designing wiring for power sources relating to the present invention.
Figure 9:
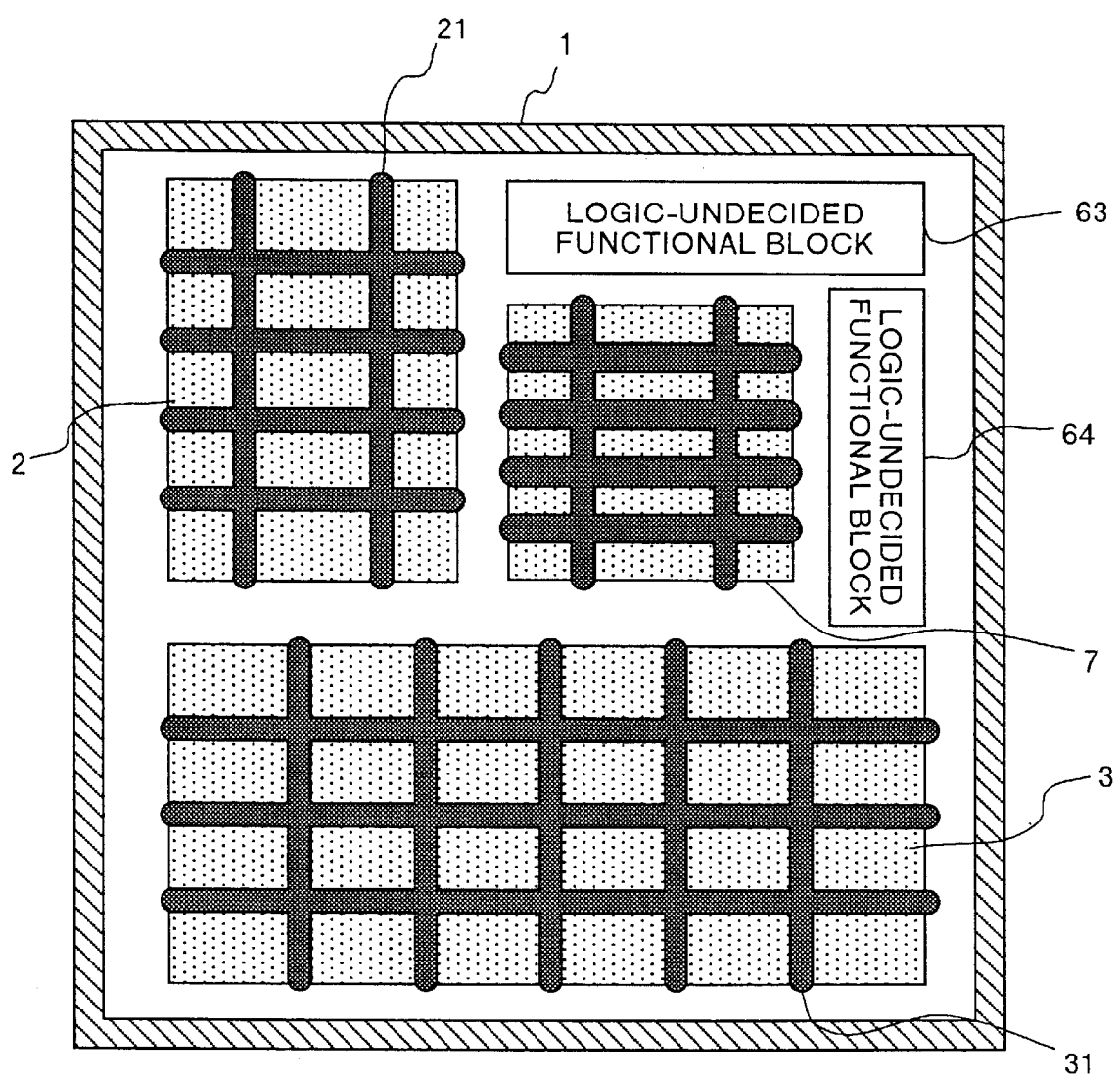
FIG. 9 is a diagram showing still another example of a state that a logic-decided functional block and a logic-undecided functional block have been installed on a semiconductor chip in the implementation of a method of designing wiring for power sources relating to the present invention.
Figure 10:
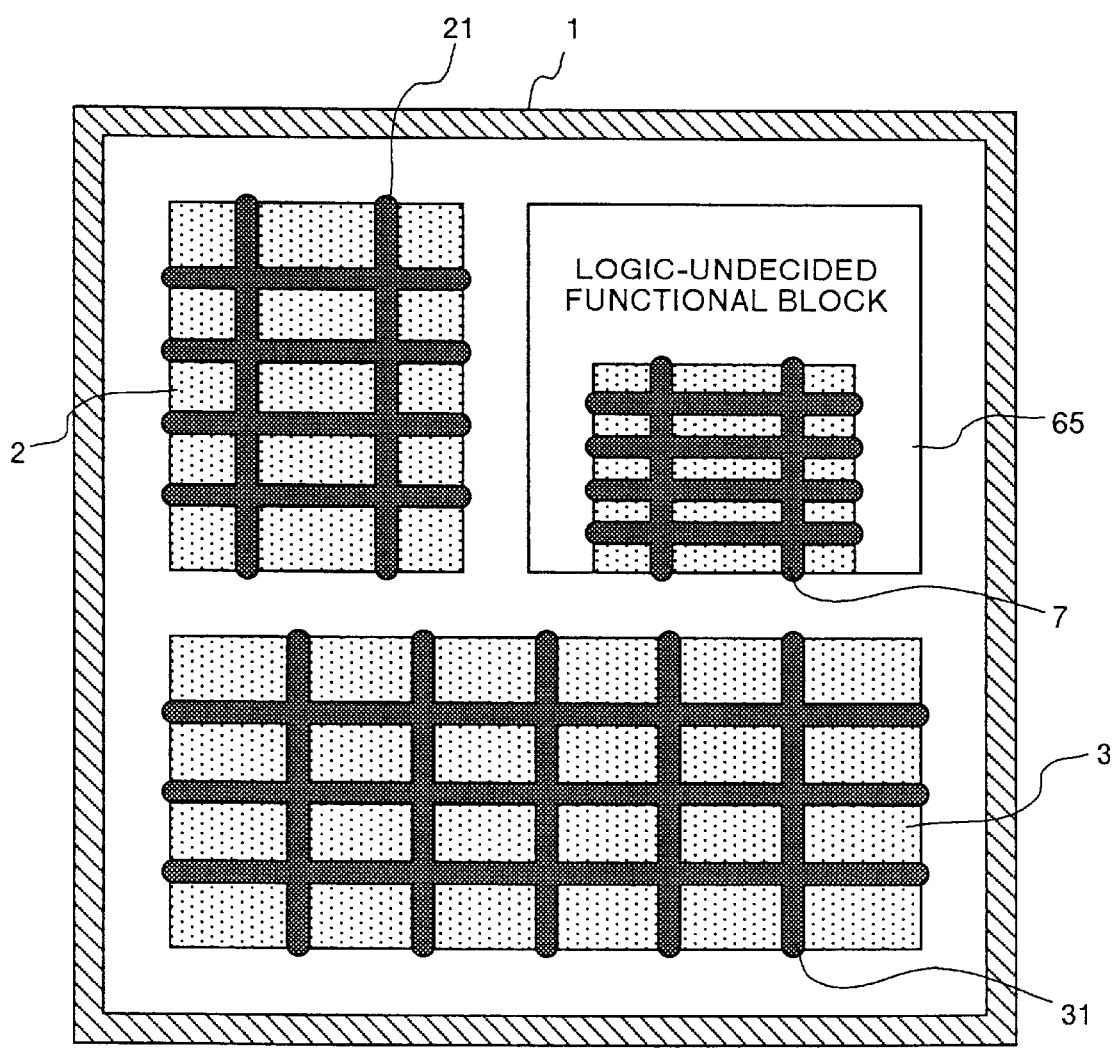
FIG. 10 is a diagram showing still another example of a state that a logic-decided functional block and a logic-undecided functional block have been installed on a semiconductor chip in the implementation of a method of designing wiring for power sources relating to the present invention.

Referring back to FIG. 2, the logic-undecided functional block is installed in the space area on the semiconductor chip (step S106). FIG. 6 is a diagram showing one example of an installation of a logic-undecided functional block 5. The shape of the logic-undecided functional block is not limited to a rectangular shape like that of the logic-undecided functional block 5 as shown in FIG. 6 or a logic-undecided functional block 61 shown in FIG. 7. For example, the shape of the logic-undecided functional block may be an L-shape like that of a logic-undecided functional block 62 that has its two sides adjacent to a logic-decided functional block 7 as shown in FIG. 8. The logic-undecided functional block may also be divided into a plurality of parts like logic-undecided functional blocks 63 and 64 as shown in FIG. 9. The shape of the logic-undecided functional block may also be a U-shape like that of a logic-undecided functional block 65 that has its three sides adjacent to a logic-decided functional block 7 as shown in FIG. 10. When the logic-undecided functional block has various shapes or when the logic-undecided functional block is divided into a plurality of parts, it is possible to carry out designing with no waste of area.

Figure 11:
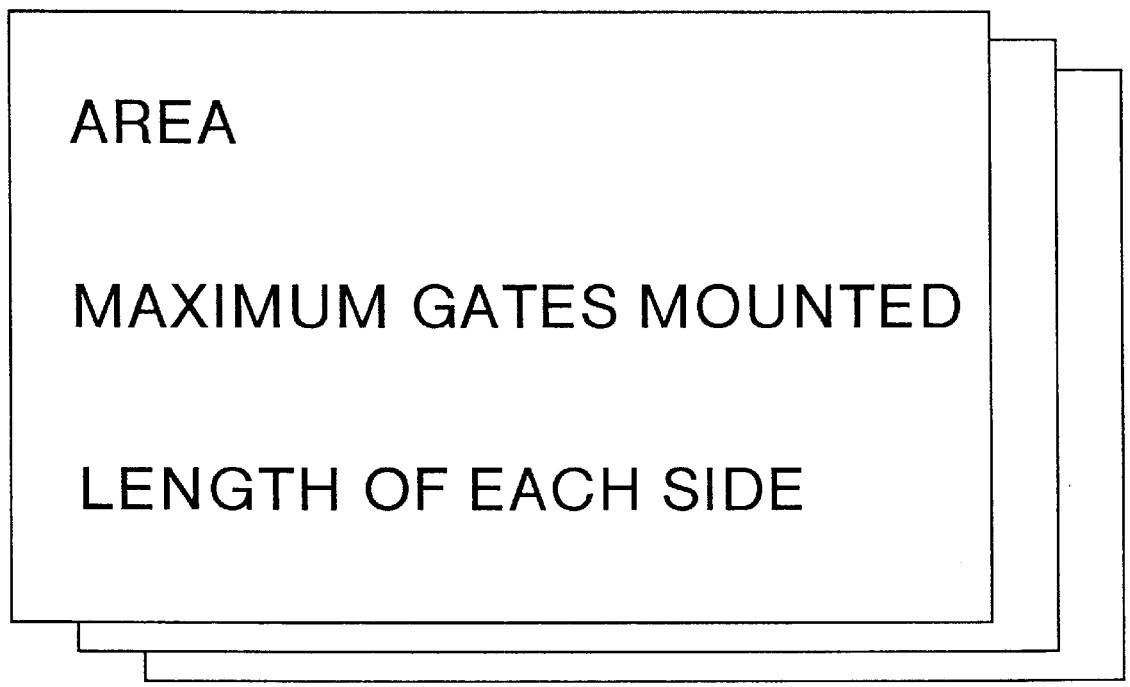
FIG. 11 is a diagram showing one example of information to be extracted for determining the logic of a logic-undecided functional block in the implementation of a method of designing wiring for power sources relating to the present invention.

After the shape and size of the logic-undecided functional block have been determined as shown in the examples of FIG. 6 to FIG. 10, the information relating to an area of the logic-undecided functional block, a maximum number of gates that can be mounted on the block, and lengths of the sides of the block is extracted (refer to FIG. 11). The extracted information is used as limit information for determining the logic of the logic-undecided functional block by calculating a maximum size of each side, and a maximum column and a maximum row of a macro that can be installed in the area allocated to the logic-undecided functional block. With this arrangement, it is possible to design a logic circuit based on this limit information in preparing the logic circuit of the logic-undecided functional block. Therefore, it is possible to accommodate the prepared logic circuit in the area allocated in advance. As a result, a layout of the LSI chip can be designed efficiently.

Figure 12:
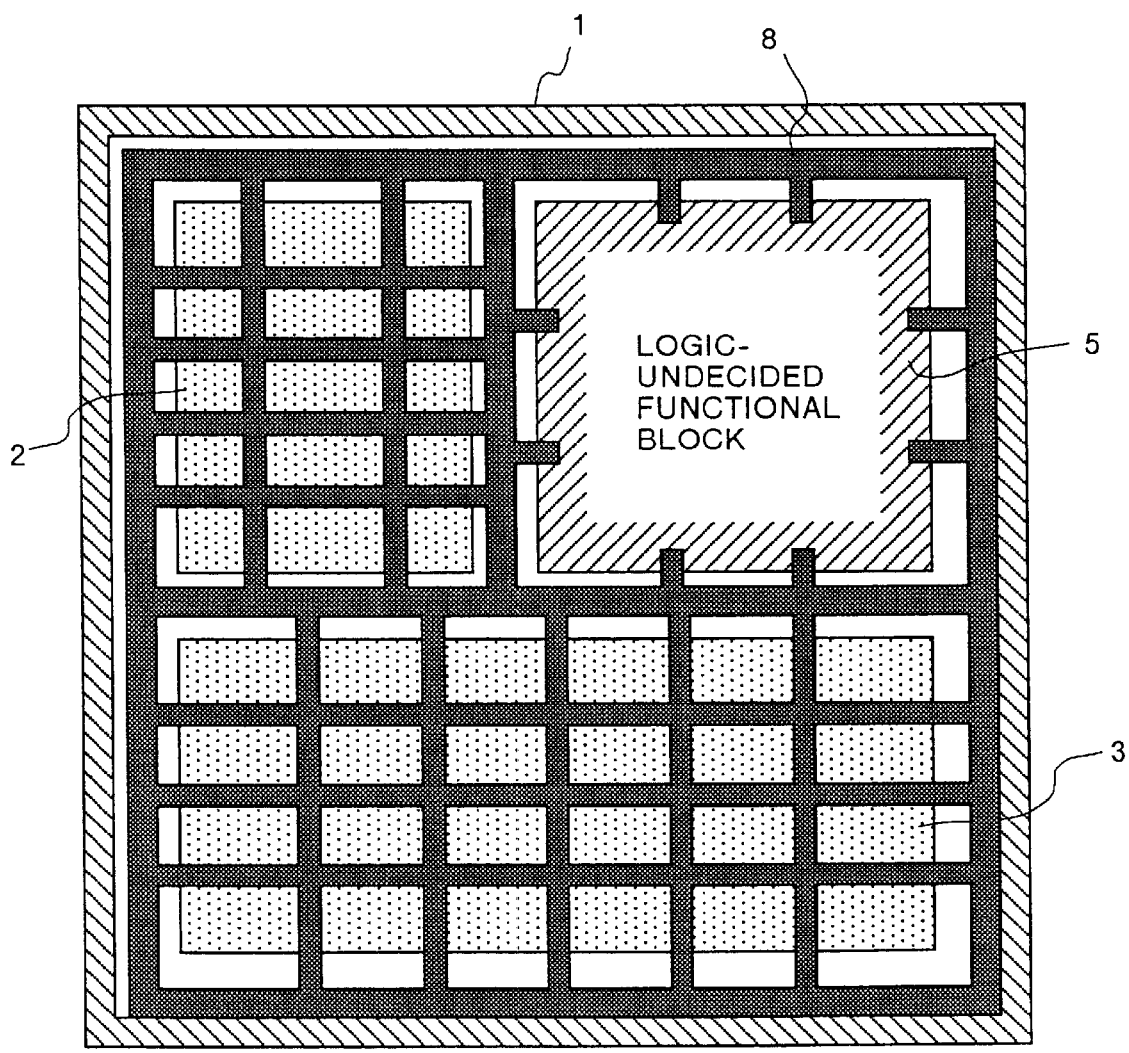
FIG. 12 is a diagram showing one example of a state that power source wiring has been provisionally provided in the implementation of a method of designing wiring for power sources relating to the present invention.
Figure 13:
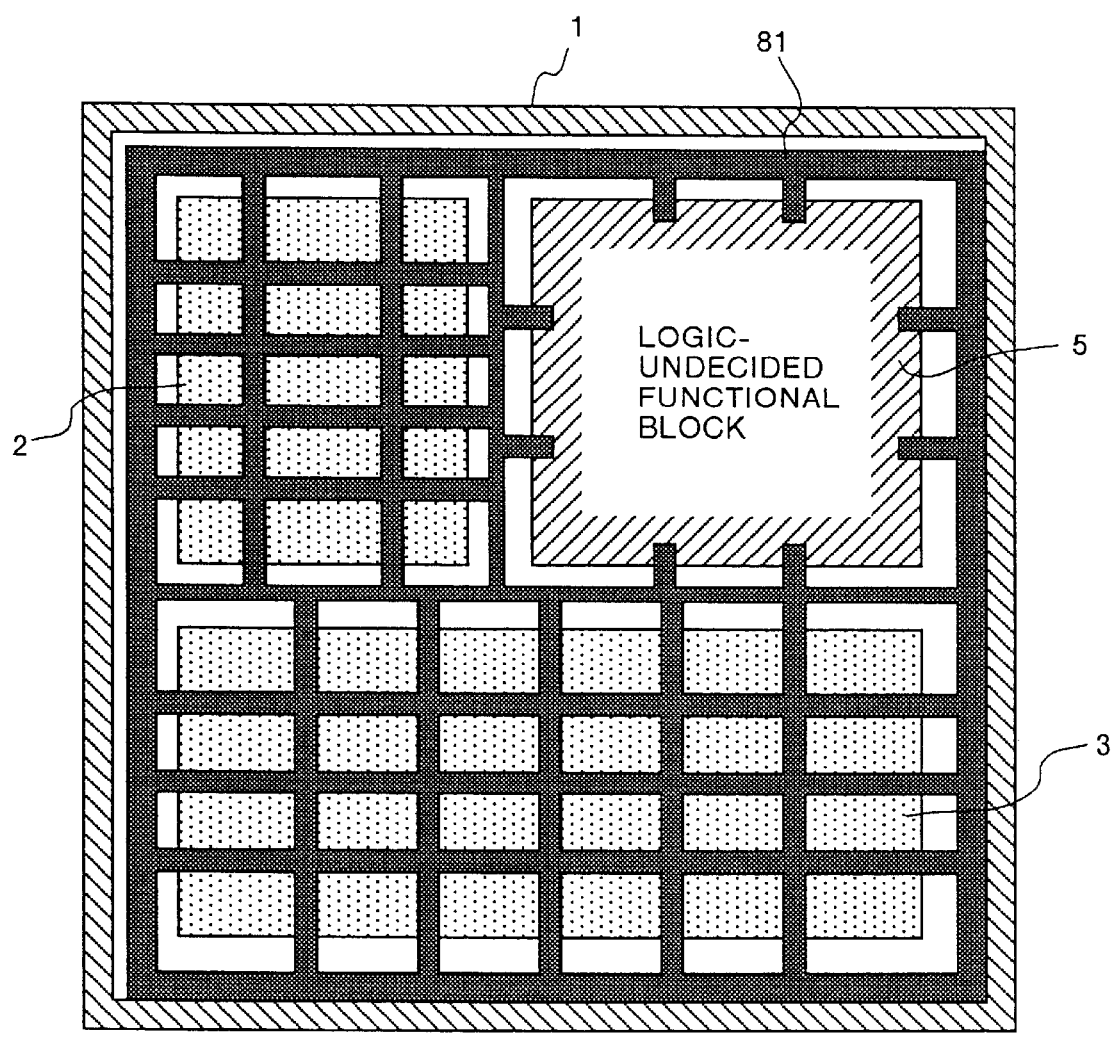
FIG. 13 is a diagram showing one example of a state that power source wiring has been optimized and provided again in the implementation of a method of designing wiring for power sources relating to the present invention.
Figure 14:
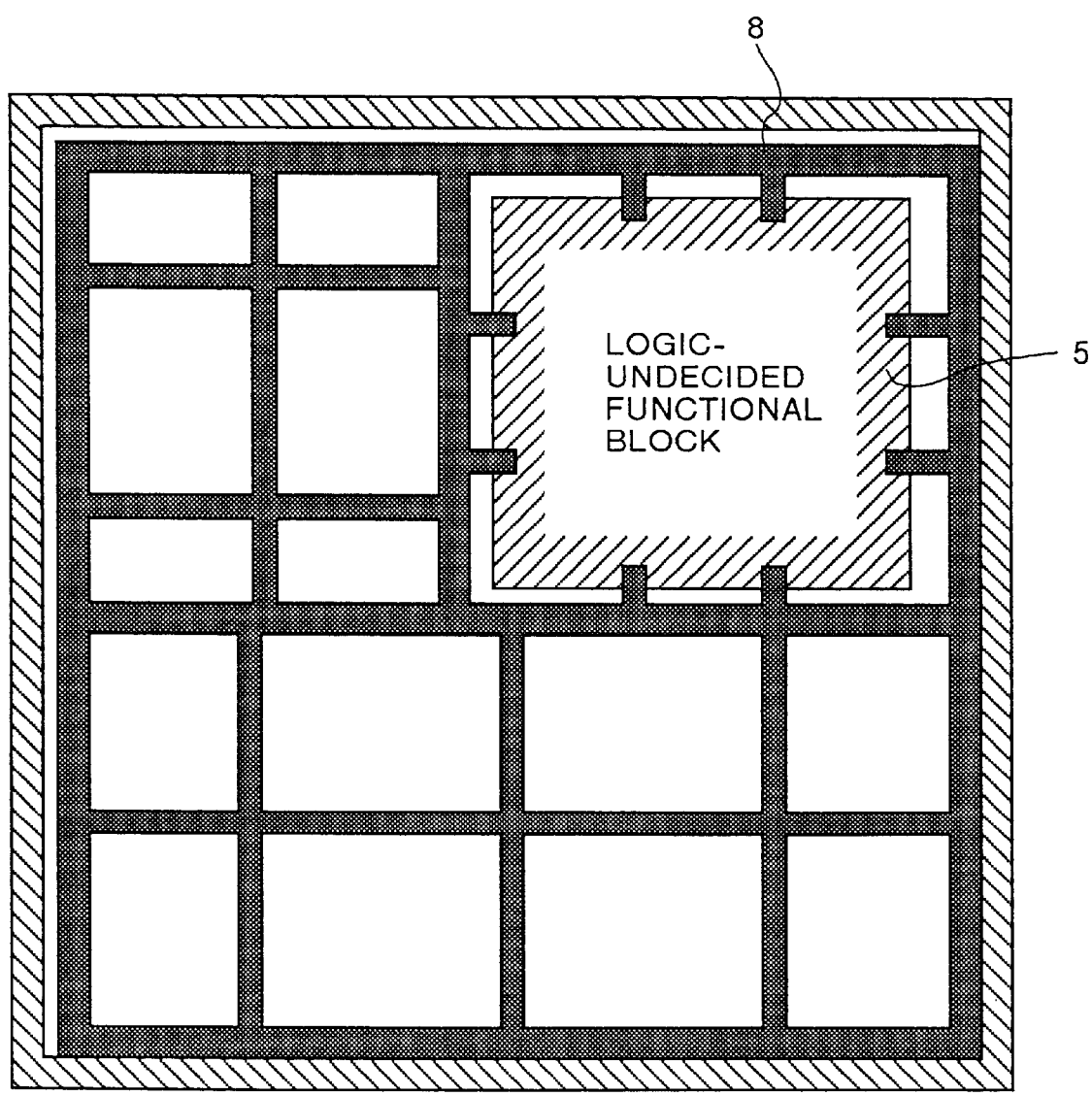
FIG. 14 is a diagram showing an extract of one example of a state that power source wiring has been provisionally provided in the implementation of a method of designing wiring for power sources relating to the present invention.

Referring back to FIG. 2, next, power source wiring is provisionally provided between a logic-decided functional block and the logic-undecided functional block in a higher layer. Thus, the logic-undecided functional block is connected to the power source wiring of each functional block (step S107). This state is shown in FIG. 12, where a reference number 8 denotes the provisional wiring of the power source. Referring back to FIG. 2, a resistor network of the provisional wiring is analyzed, and an optimum width of the power source wiring is determined. Based on the width, the power source wiring is rewired (step S108) Then, the designing of the power source wiring is finished. This state is shown in FIG. 13, where a reference number 81 denotes the power source wiring after the rewiring. FIG. 14 is a diagram showing an extract of one example of a state that the power source wiring has been provisionally provided, and FIG. 15 is a diagram showing power source wiring data shown in FIG. 14 as a net list of the resistor network.

Figure 15:
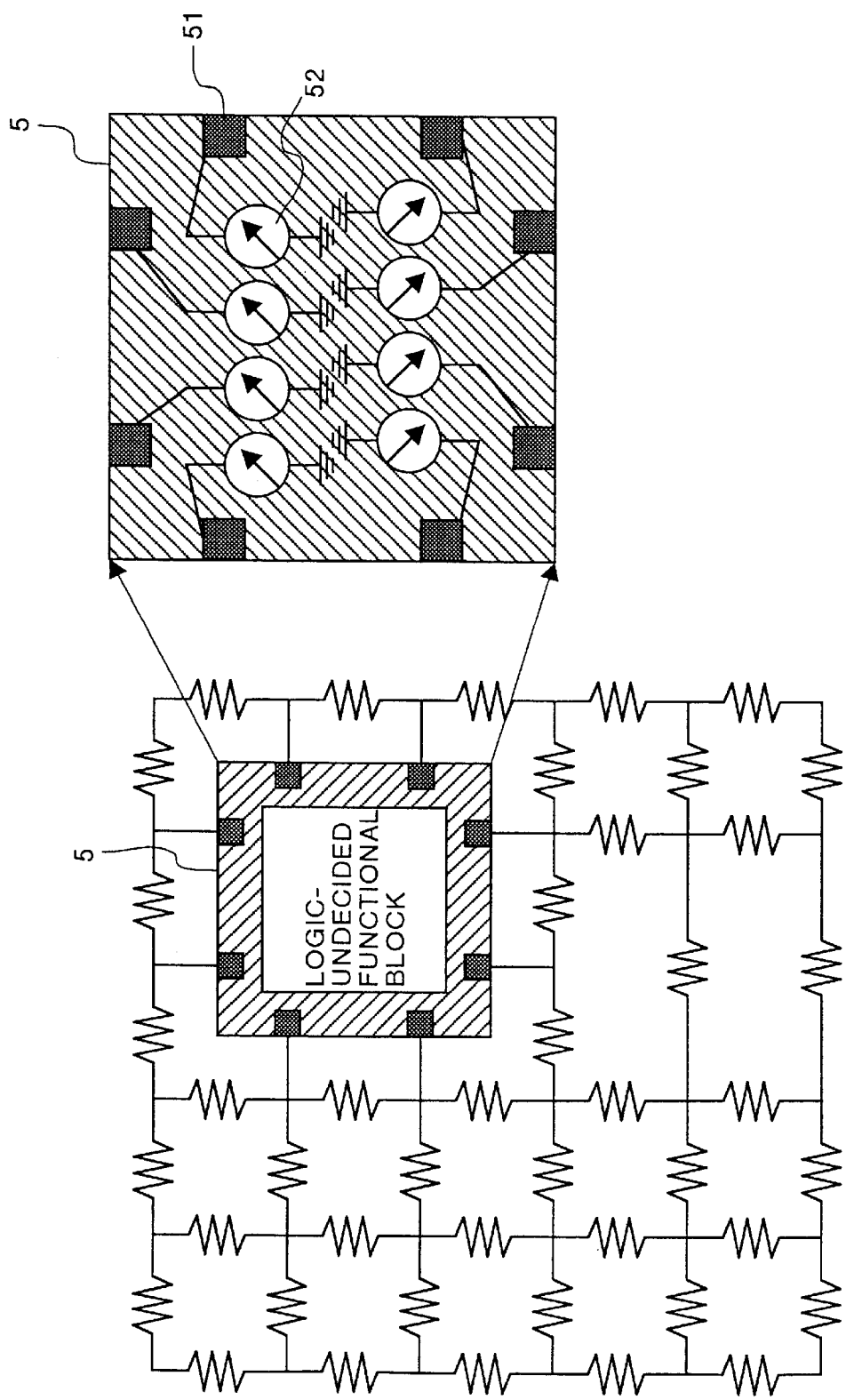
FIG. 15 is a diagram showing power source wiring data shown in FIG. 14 as a net list of a resistor network.
Figure 16:
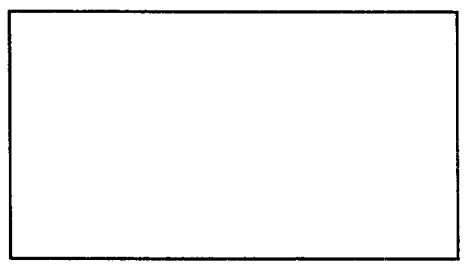
FIG. 16 is a diagram for explaining a first example of a method of determining a power source terminal position in the implementation of a method of designing wiring for power sources relating to the present invention.
Figure 16:
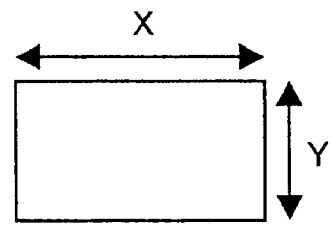
Figure 16:
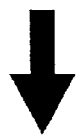
Figure 17:
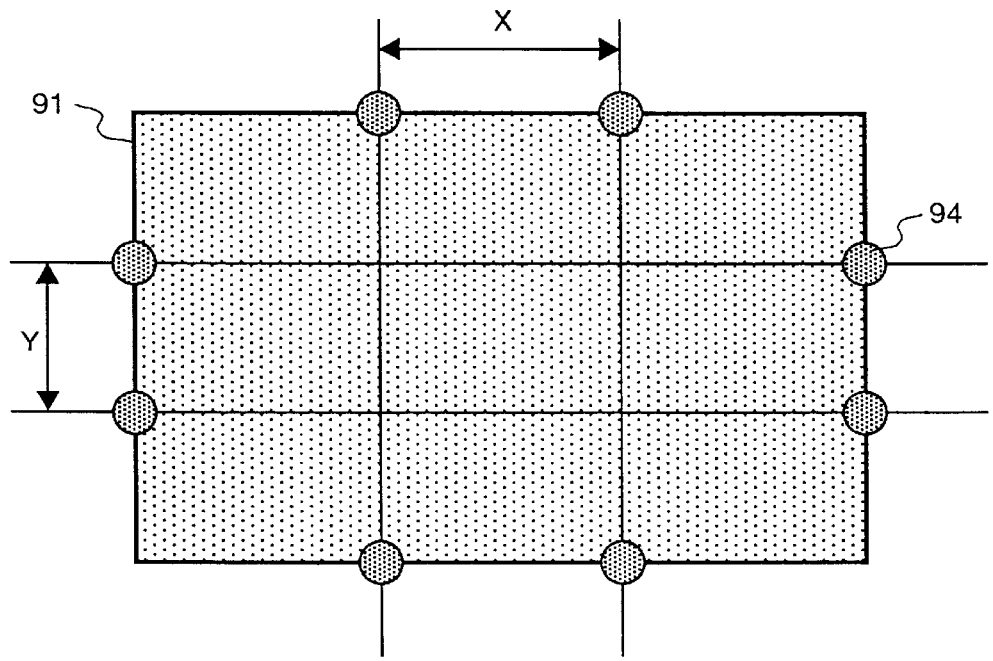
FIG. 17 is a diagram for explaining the first example of a method of determining a power source terminal position in the implementation of a method of designing wiring for power sources relating to the present invention.
Figure 18:
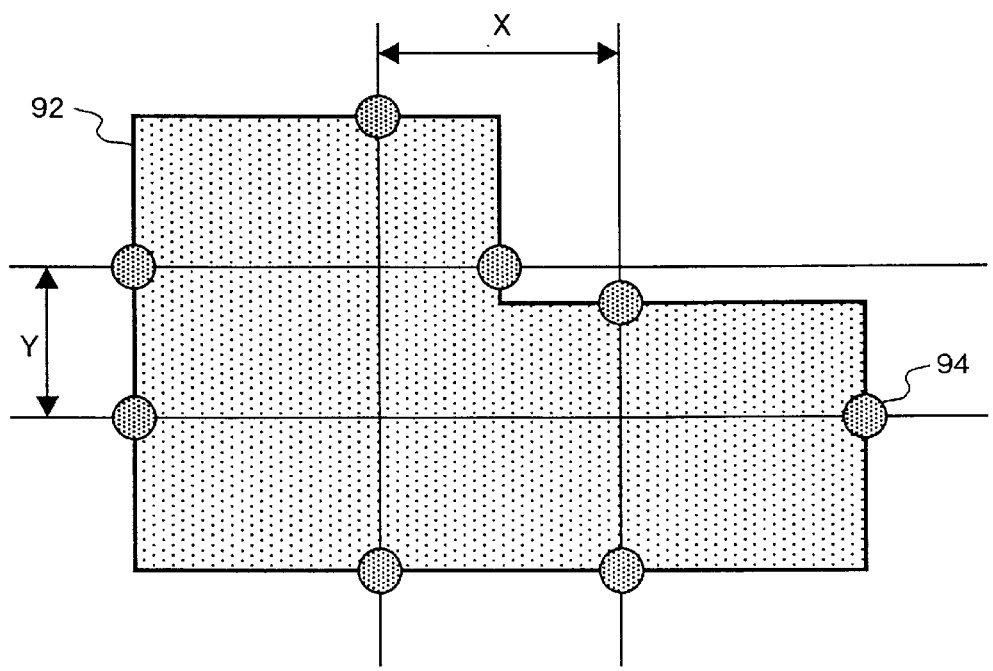
FIG. 18 is a diagram for explaining the first example of a method of determining a power source terminal position in the implementation of a method of designing wiring for power sources relating to the present invention.
Figure 19:
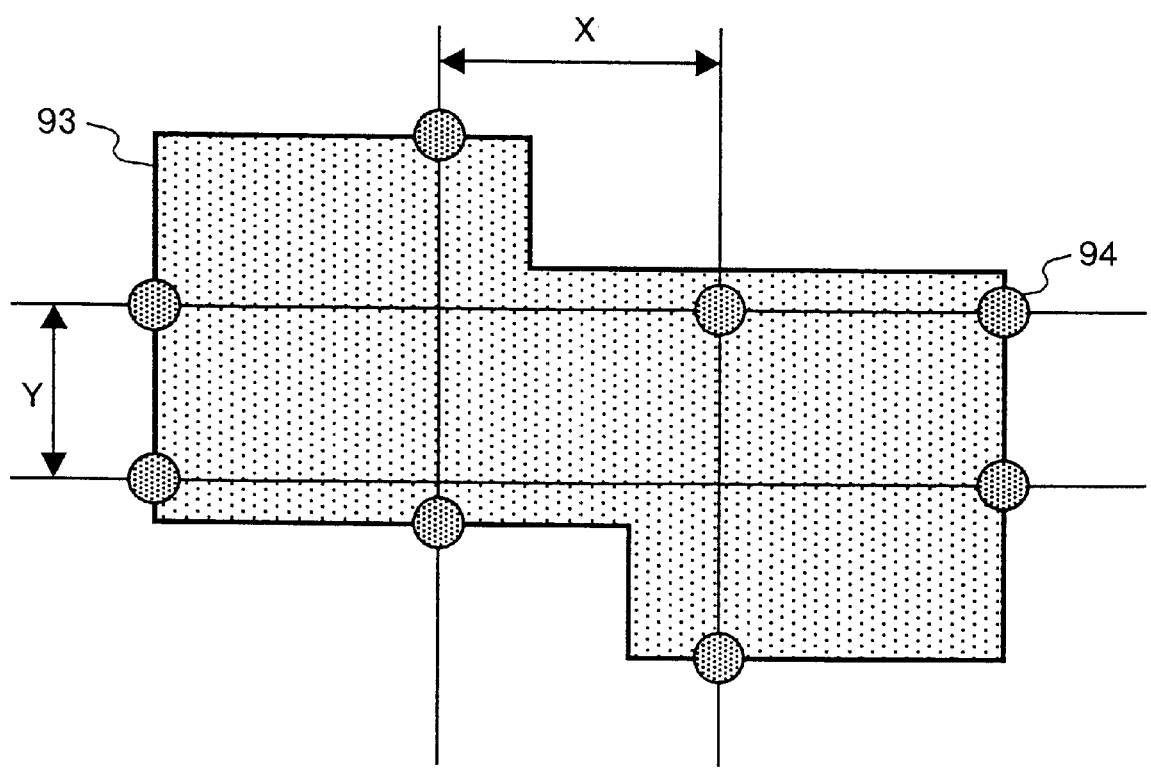
FIG. 19 is a diagram for explaining the first example of a method of determining a power source terminal position in the implementation of a method of designing wiring for power sources relating to the present invention.
Figure 20:
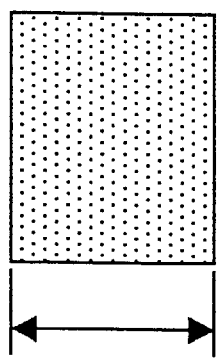
FIG. 20 is a diagram for explaining a second example of a method of determining a power source terminal position in the implementation of a method of designing wiring for power sources relating to the present invention.
Figure 20:
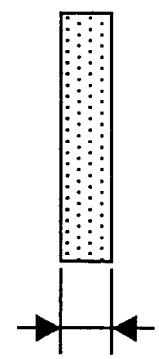
Figure 20:
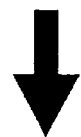
Figure 20:
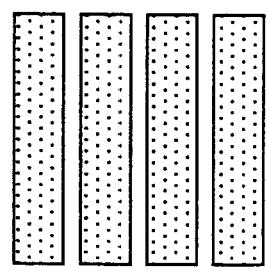
Figure 21:
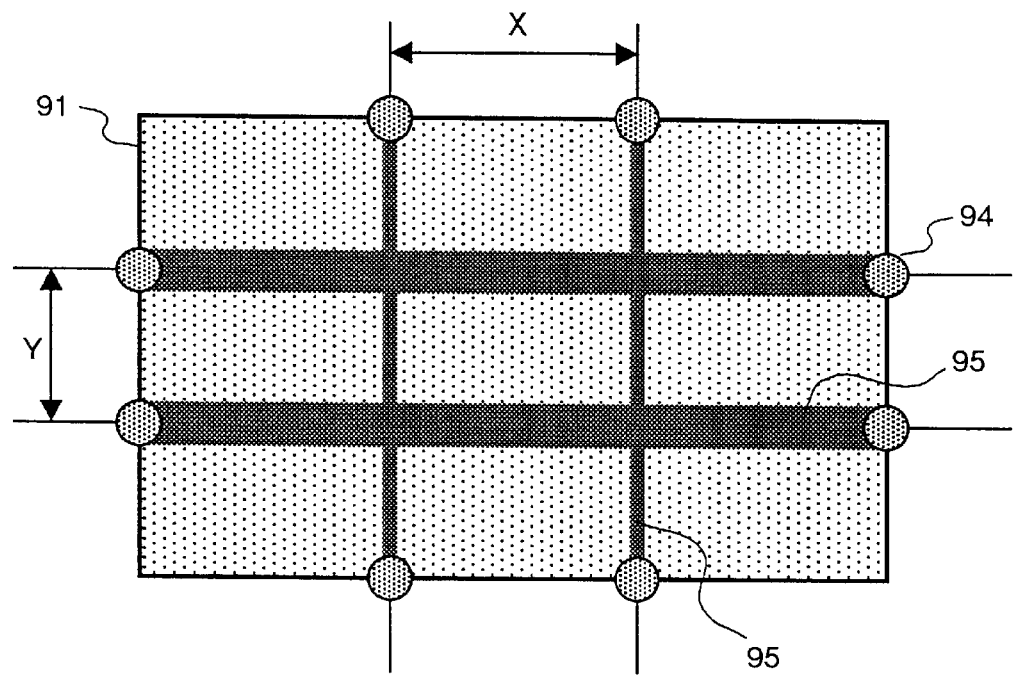
FIG. 21 is a diagram for explaining the second example of a method of determining a power source terminal position in the implementation of a method of designing wiring for power sources relating to the present invention.
Figure 22:
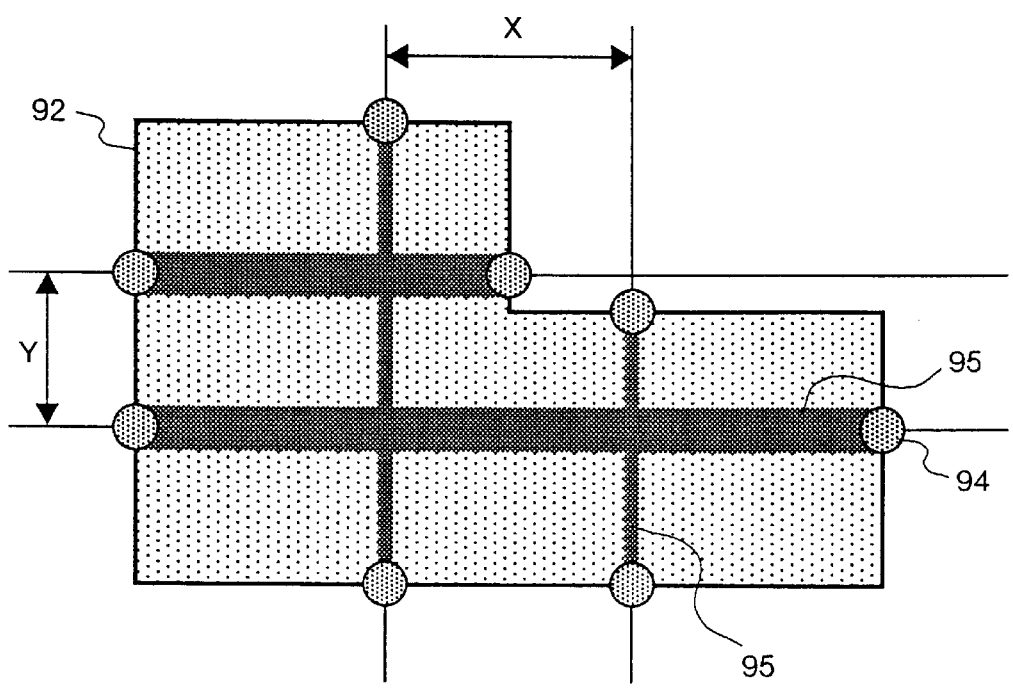
FIG. 22 is a diagram for explaining the second example of a method of determining a power source terminal position in the implementation of a method of designing wiring for power sources relating to the present invention.
Figure 23:
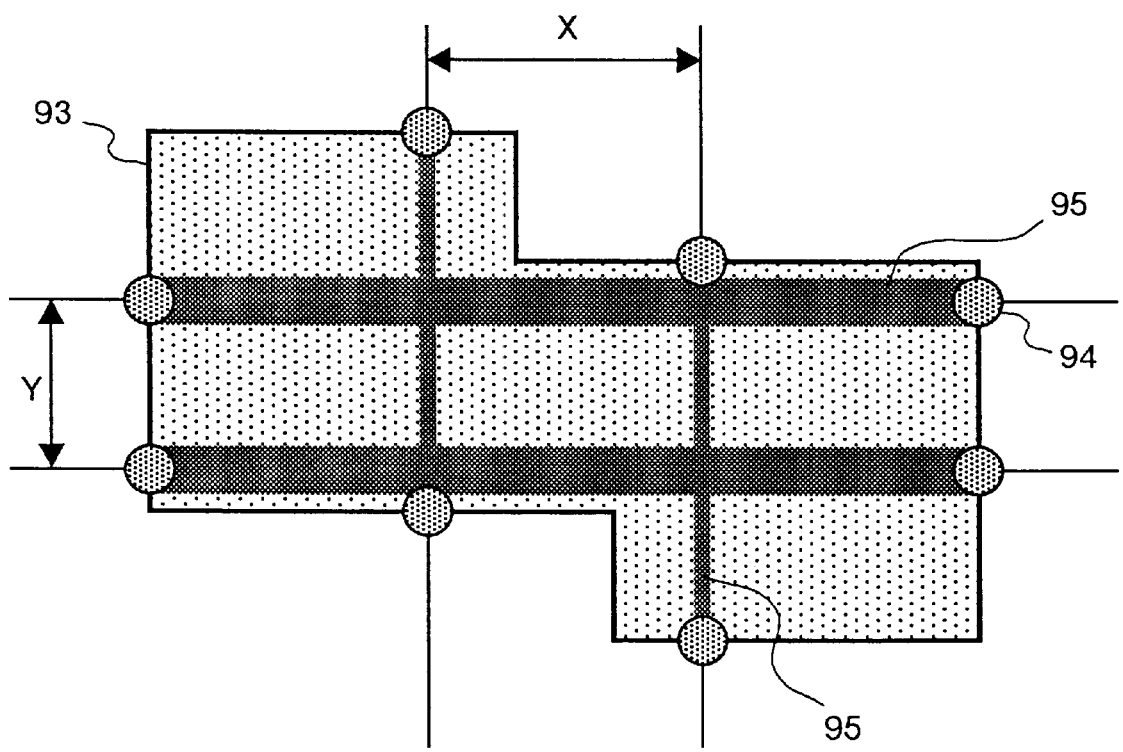
FIG. 23 is a diagram for explaining the second example of a method of determining a power source terminal position in the implementation of a method of designing wiring for power sources relating to the present invention.

As shown in FIG. 15, in analyzing the resistor network of the provisional wiring of the higher layer, it is assumed that a current source 52 has been connected to a power source terminal 51 of the logic-undecided functional block 5, for the resistor network within the logic-undecided functional block 5. Based on this assumption, it is possible to estimate a worst condition for an area occupied by the power source wiring necessary for the logic-undecided functional block 5. In other words, it is possible to estimate a maximum area. Therefore, the logic of the logic-undecided functional block 5 is decided after finishing the designing of the wiring in the higher layer. Thus, when the actual power source wiring is designed for the logic-undecided functional block 5, the actual width of the power source wiring becomes equal to or smaller than the width of the power source wiring estimated earlier.

Next, a method of determining a power source terminal position of the logic-undecided functional block will be explained.

FIG. 16 to FIG. 19 are diagrams for explaining a first example of a method of determining the power source terminal position. In this example, pitches of the power source terminal position in an X direction (a lateral direction) and a Y direction (a vertical direction) that become basic pitches are determined respectively. A starting point (not shown) is determined in each area of logic-undecided functional blocks 91, 92 and 93 respectively. From this starting point, lines are drawn at the pitch of the power source terminal position in the X direction (the lateral direction) and at the pitch of the power source terminal position in the Y direction (the vertical direction) such that the lines are parallel with the periphery of each of the logic-undecided functional blocks 91, 92 and 93.

A cross point of each parallel line with the periphery of each of the logic-undecided functional blocks 91, 92 and 93 becomes a position of a power source terminal 94. When the pitches of the power source terminal position in the X direction (the lateral direction) and in the Y direction (the vertical direction) are larger than the sizes of the logic-undecided functional block, only one power source wiring is provided at the center of the logic-undecided functional block. A cross point of the power source wiring provided at the center with the periphery of the logic-undecided functional block is set as a power source terminal position.

FIG. 20 to FIG. 23 are diagrams for explaining a second example of a method of determining the power source terminal position. In this example, first, the width (W) of the power source wiring necessary within the logic-undecided functional block obtained for determining the area of the logic-undecided functional block at the above-described step S102 is divided by a reference width (a basic width) per one power source wiring. Thus, a necessary number of power source terminals is obtained in the X direction (the lateral direction) and in the Y direction (the vertical direction) respectively. Electric wiring 95 is provided at equal intervals by the number obtained in the X direction (the lateral direction) and in the Y direction (the vertical direction) respectively. Then, a cross point of each power source wiring 95 with the periphery of each of the logic-undecided functional blocks 91, 92 and 93 is set as a position of a power source terminal 94.

When the basic width of the power source wiring in the X direction (the lateral direction) and in the Y direction (the vertical direction) is larger than the width (W) of the power source wiring necessary within the logic-undecided functional block, only one power source wiring is provided at the center of the logic-undecided functional block without dividing the width of the power source wiring. A cross point of the power source wiring provided at the center with the periphery of the logic-undecided functional block is set as a power source terminal position.

Figure 24:
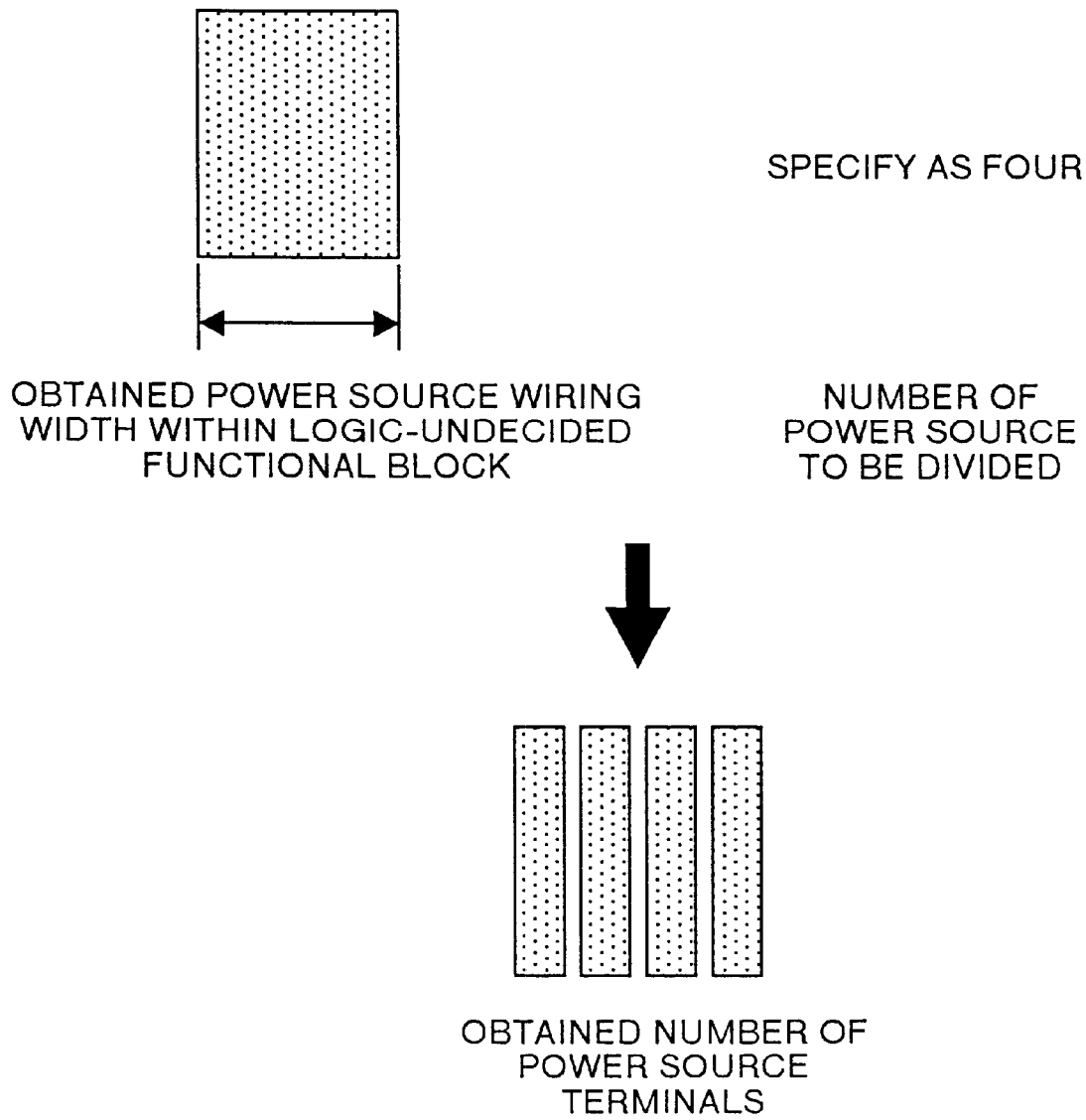
FIG. 24 is a diagram for explaining a third example of a method of determining a power source terminal position in the implementation of a method of designing wiring for power sources relating to the present invention.

FIG. 24 is a diagram for explaining a third example of a method of determining a power source terminal position. In this example, the number of dividing the width (W) of the power source wiring necessary within the logic-undecided functional block is determined in advance in the X direction (the lateral direction) and in the Y direction (the vertical direction) respectively. The width (W) of the power source wiring necessary within the logic-undecided functional block obtained for determining the area of the logic-undecided functional block at the above-described step S102 is divided by the predetermined dividing number, in the X direction (the lateral direction) and in the Y direction (the vertical direction) respectively. Thus, electric wiring is provided at equal intervals. Then, a cross point of each power source wiring with the periphery of the logic-undecided functional block is set as a power source terminal position (refer to FIG. 21 to FIG. 23).

Figure 25:
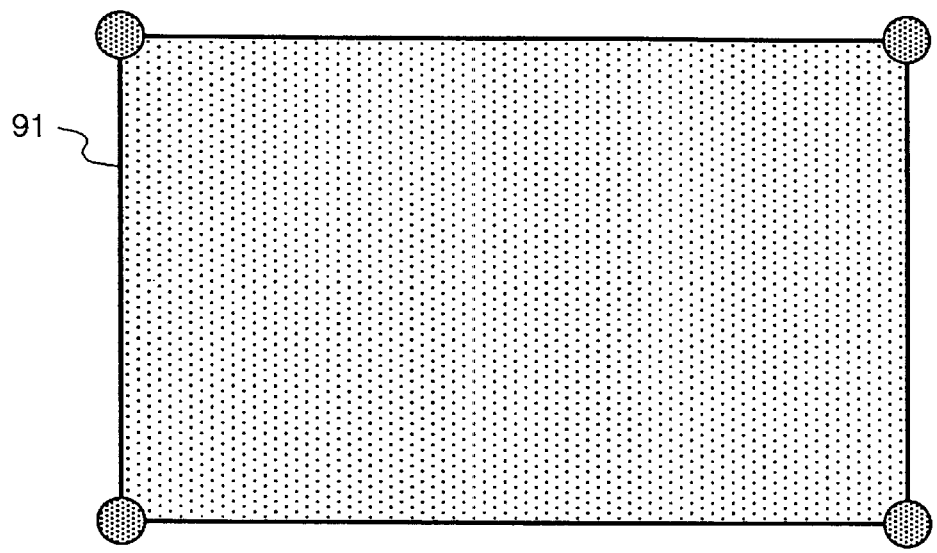
FIG. 25 is a diagram for explaining a position where the installation of a power source terminal is prohibited in the implementation of a method of designing wiring for power sources relating to the present invention.
Figure 26:
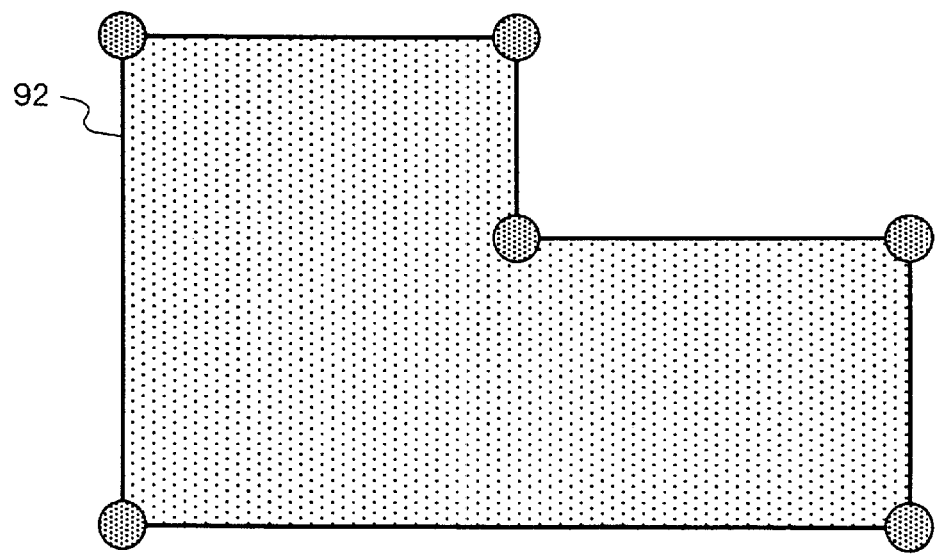
FIG. 26 is a diagram for explaining a position where the installation of a power source terminal is prohibited in the implementation of a method of designing wiring for power sources relating to the present invention.
Figure 27:
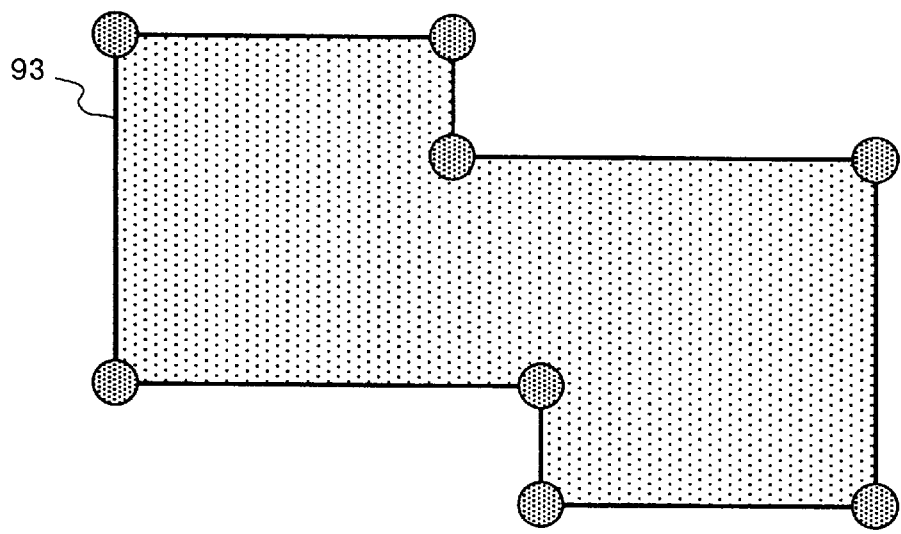
FIG. 27 is a diagram for explaining a position where the installation of a power source terminal is prohibited in the implementation of a method of designing wiring for power sources relating to the present invention.

In determining a power source terminal position based on the first to third examples of a method of determining a power source terminal position, a power source terminal is not installed at each corner of the logic-undecided functional blocks 91, 92 and 93 respectively, as shown in FIG. 25 to FIG. 27. This is for preventing a current from being concentrated at the corners of the logic-undecided functional blocks 91, 92 and 93. When a candidate position of the installation of a power source terminal position obtained in the first to third examples of a method of determining a power source terminal position is a corner of the logic-undecided functional block, for example, the power source terminal is installed again at a separate position other than the corners on the periphery of the logic-undecided functional block. In FIG. 25 to FIG. 27, black circles at corners in the logic-undecided functional blocks 91, 92 and 93 show the points where the installation of a power source terminal is prohibited.

Figure 28:
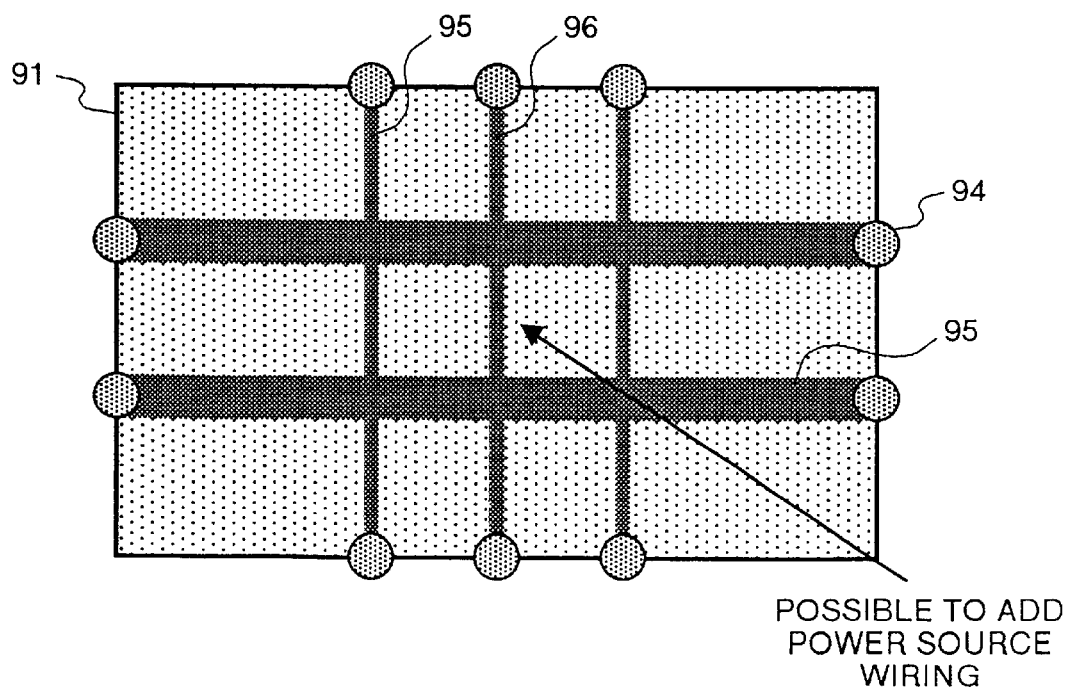
FIG. 28 is a diagram for explaining an addition of a power source terminal and power source wiring in the implementation of a method of designing wiring for power sources relating to the present invention.
Figure 29:
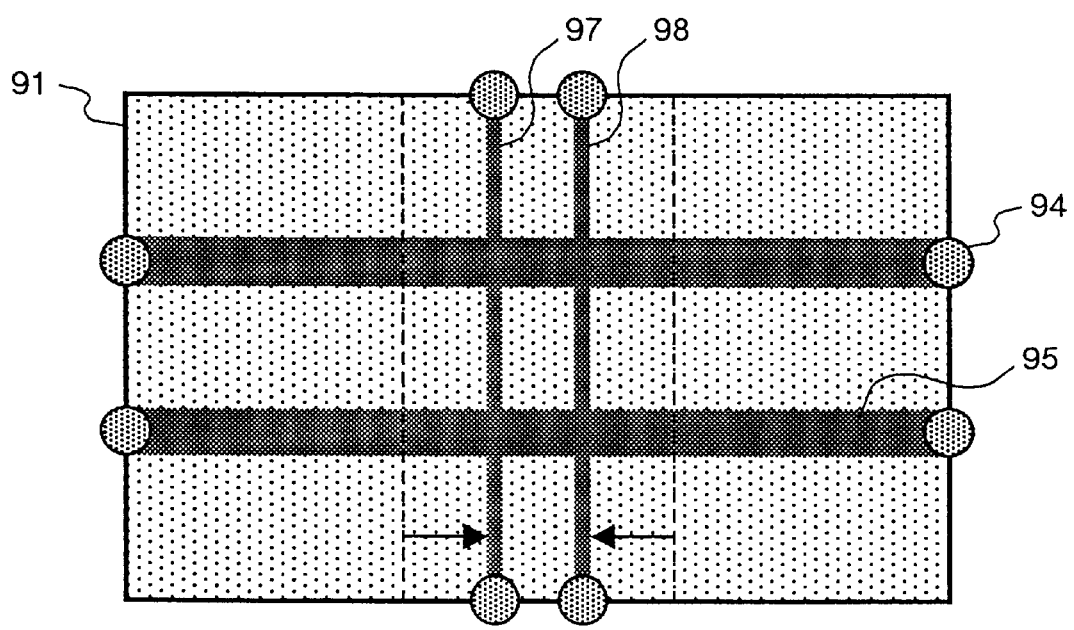
FIG. 29 is a diagram for explaining a move of a power source terminal and power source wiring in the implementation of a method of designing wiring for power sources relating to the present invention.

After a power source terminal position has been determined based on the first to third examples of a method of determining a power source terminal position, it is possible to suitably add power source terminals and to additionally provide power source wiring 96 as shown in FIG. 28. Further, after a power source terminal position has been determined based on the first to third examples of a method of determining a power source terminal position, it is possible to suitably move the positions of power source terminals along the periphery of the logic-undecided functional block and to move the positions of power source wiring 97 and 98 as shown in FIG. 29.

Figure 30:
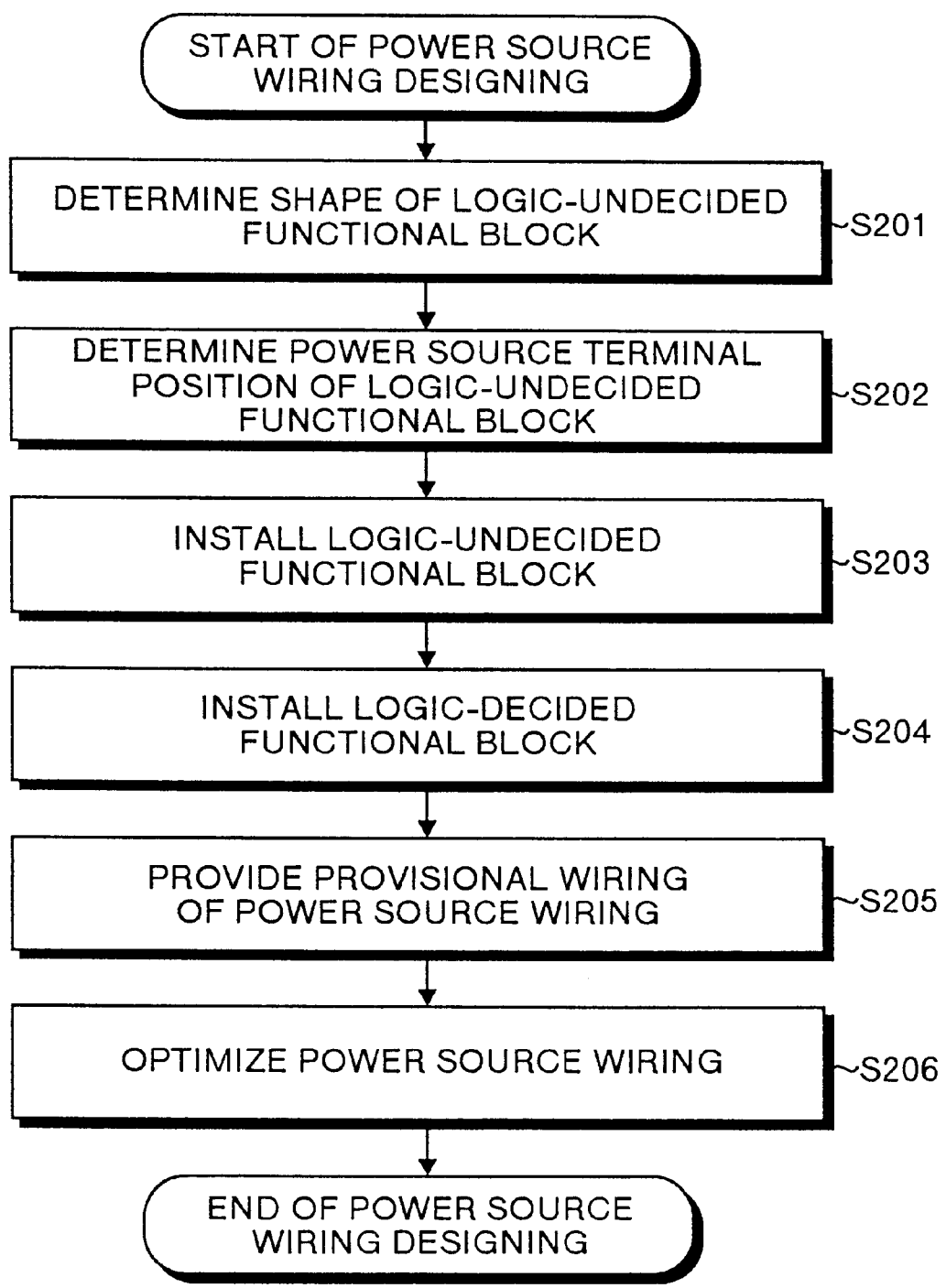
FIG. 30 is a flowchart showing another example of a method of designing wiring for power sources relating to the present invention.

FIG. 30 is a flowchart showing the method of designing wiring for power sources relating to the second embodiment of the present invention. In this embodiment, when the designing of power source wiring for a semiconductor chip has been started, a shape of a logic-undecided functional block is first determined, when there is a logic-undecided functional block (step S201). In this case, the logic-undecided functional block has a target size that is determined in advance based on the information including an estimated area of a cell, estimated power consumption, and operation voltage that are used in the logic-undecided functional block. The shape of the logic-undecided functional block is determined based on this size.

Figure 31:
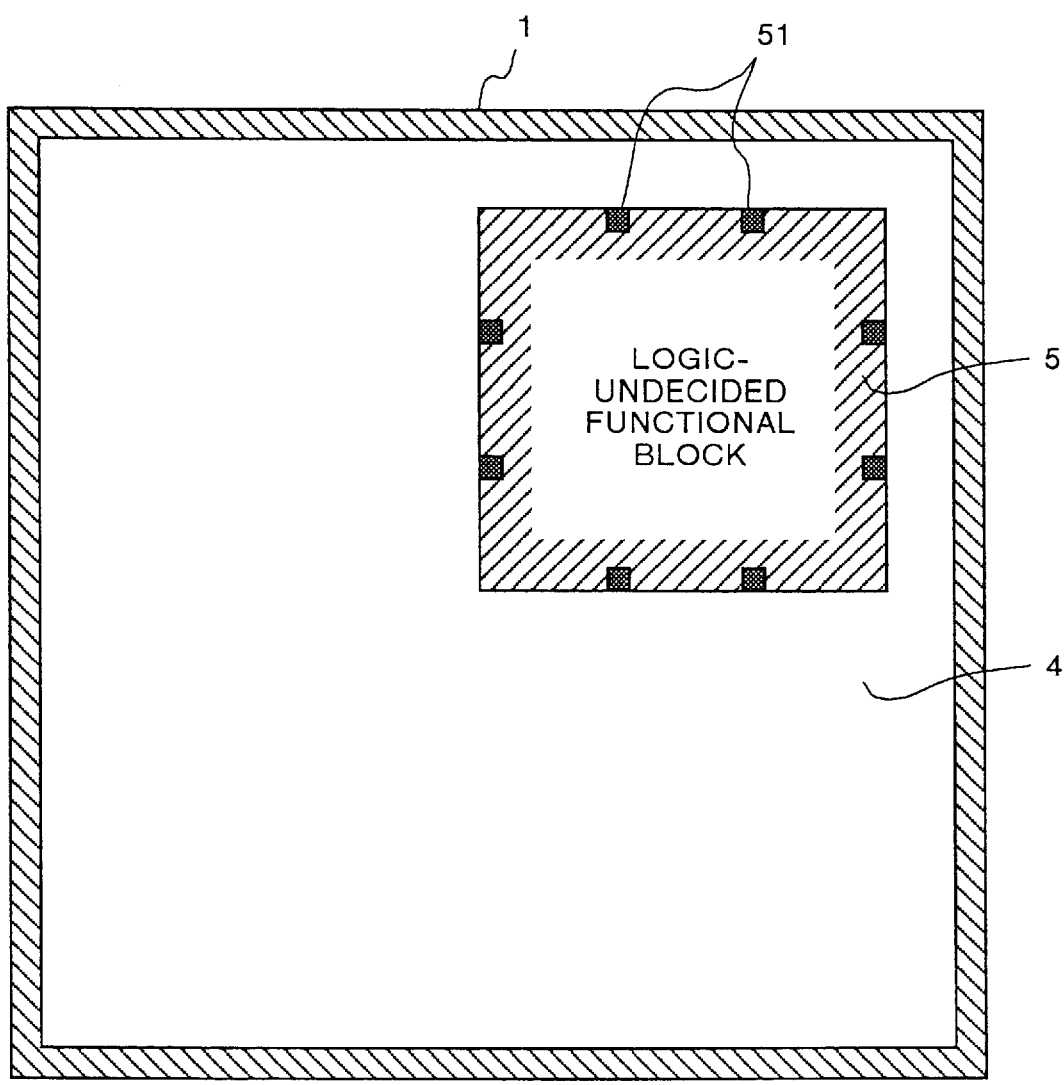
FIG. 31 is a diagram showing one example of a state that a logic-undecided functional block has been installed on a semiconductor chip in the implementation of a method of designing wiring for power sources relating to the present invention.

Next, a power source terminal position of the logic-undecided functional block is determined (step S202) A method of determining a power source terminal position is as explained in the above first to third examples. Next, the logic-undecided functional block is installed on the semiconductor chip (step S203). This state is shown in FIG. 31. Referring back to FIG. 30, a logic-decided functional block is installed in a space area (as dented by a reference number 4 in FIG. 31) on the semiconductor chip in which no logic-undecided functional block has been installed (step S204). As a result, a state shown in FIG. 6 is obtained.

Referring back to FIG. 30, next, power source wiring is provisionally provided between the logic-decided functional block and the logic-undecided functional block in a higher layer. Thus, the logic-undecided functional block is connected to the power source wiring of each functional block (step S205). This state is the same as that shown in FIG. 12. Referring back to FIG. 30, a resistor network of the provisional wiring is analyzed, and an optimum width of the power source wiring is determined. Based on the width, the power source wiring is rewired (step S206). Then, the designing of the power source wiring is finished. This state is the same as that shown in FIG. 13. As explained in the first embodiment of the method of designing wiring for power sources with reference to FIG. 15, a resistor network of the power source wiring within the logic-undecided functional block 5 is prepared based on the assumption that a current source 52 has been connected to a power source terminal 51 of the logic-undecided functional block 5.

According to the second embodiment, a width of the power source wiring necessary within the logic-undecided functional block 5 is estimated based on the power consumption information of the logic-undecided functional block 5. It is possible to determine an area of the logic-undecided functional block 5 using this estimate. In the higher layer, the power source wiring is provisionally provided. By analyzing the resistor network of this provisional wiring, it is possible to estimate an optimum width of the power source wiring.

Therefore, even when an actual designing of the power source wiring within the logic-undecided functional block 5 of which logic has been decided is carried out once after the designing of the power source wiring in the higher layer has been finished, the actual width of the power source wiring within the logic-undecided functional block 5 becomes equal to or smaller than the width estimated earlier. Further, the actual width of the power source wiring 5 in the higher layer also becomes equal to or smaller than the width estimated earlier. As a result, it is possible to avoid an occurrence of such a situation where the designing must be carried out again starting from the floor plan of the whole chip due to a shortage in the power supply after the logic of the logic-undecided functional block 5 has become firm. Thus, it is possible to efficiently design the LSI chip.

The present invention is not limited to the above-described embodiments and exemplified examples, and it is also possible to modify the invention in various manners.

As explained above, according to the present invention, even when an actual designing of the power source wiring within the logic-undecided functional block of which logic has been decided is carried out once after the designing of the power source wiring in the higher layer has been finished, the actual width of the power source wiring within the logic-undecided functional block becomes equal to or smaller than the width estimated earlier. Further, the actual width of the power source wiring in the higher layer also becomes equal to or smaller than the width estimated earlier. As a result, it is possible to avoid an occurrence of such a situation where the designing must be carried out again starting from the floor plan of the whole chip due to a shortage in the power supply after the logic of the logic-undecided functional block has become firm. Thus, it is possible to efficiently design the LSI chip.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of designing wiring for power sources in a semiconductor chip comprising:

obtaining information necessary for determining an area of a logic-undecided functional block;

determining the area of the logic-undecided functional block based on the obtained information;

installing a logic-decided functional block on the semiconductor chip;

determining a shape of the logic-undecided functional block, to match a space area of the semiconductor chip on which the logic-decided functional block has been installed;

determining a power source terminal position of the logic-undecided functional block;

installing the logic-undecided functional block in a space area on the semiconductor chip;

providing a provisional wiring of power source between the logic-decided functional block and the logic-undecided functional block; and determining a width of the power source wiring by analyzing a resistor network of the provisionally-provided power source wiring, and rewiring the power source wiring based on the width.

2. The method of designing wiring for power sources in a semiconductor chip according to claim 1, wherein in rewiring the provisional wiring of power source wiring, a local resistor network of the power source wiring within the logic-undecided functional block is prepared by assuming that current sources have been connected to power source terminals of the logic-undecided functional block, a resistor network of a total power source wiring is prepared based on this local resistor network, and the rewiring of the power source wiring is carried out based on the resistor network of the total power source wiring.

3. The method of designing wiring for power sources in a semiconductor chip according to claim 1, wherein in determining an area of the logic-undecided functional block, a width W of power source wiring necessary within the logic-undecided functional block is obtained based on power consumption information obtained from operation frequency, operation rate, power supply voltage used, a number of gates, environmental temperature, and current density of the logic-undecided functional block respectively, and an area S of the logic-undecided functional block is obtained from the following expression, $$S = N \times s/\alpha + W,$$

based on this W, a number N of gates to be used within the logic-undecided functional block, an area s occupied by one gate, and the rate $\alpha$ of gates within the logic-undecided functional block.

4. The method of designing wiring for power sources in a semiconductor chip according to claim 1, wherein in determining a power source terminal position of the logic-undecided functional block, the power source terminal position is determined based on basic pitches of the power source terminal position in a vertical direction and a lateral direction of the logic-undecided functional block respectively.

5. The method of designing wiring for power sources in a semiconductor chip according to claim 4, wherein when a candidate position of the installation of a power source terminal position of the logic-undecided functional block is a corner of the logic-undecided functional block, the power source terminal is installed again at a separate position other than corners on the periphery of the logic-undecided functional block.

6. The method of designing wiring for power sources in a semiconductor chip according to claim 4, wherein an installation position of the power source terminal of the logic-undecided functional block is moved along the periphery of the logic-undecided functional block.

7. The method of designing wiring for power sources in a semiconductor chip according to claim 4, wherein
an installation position of the power source terminal of the logic-undecided functional block is added.

8. The method of designing wiring for power sources in a semiconductor chip according to claim 1, wherein
in determining a power source terminal position of the logic-undecided functional block,
a width W of power source wiring necessary within the logic-undecided functional block is obtained based on power consumption information obtained from operation frequency, operation rate, power supply voltage used, a number of gates, environmental temperature, and current density of the logic-undecided functional block respectively, in a vertical direction and a lateral direction of the logic-undecided functional block respectively,
a necessary width of the power source wiring is obtained based on this W and a basic width of the power source wiring, and
the power source terminal position is determined based on the width of the power source wiring.

9. The method of designing wiring for power sources in a semiconductor chip according to claim 8, wherein
when a candidate position of the installation of a power source terminal position of the logic-undecided functional block is a corner of the logic-undecided functional block, the power source terminal is installed again at a separate position other than corners on the periphery of the logic-undecided functional block.

10. The method of designing wiring for power sources in a semiconductor chip according to claim 8, wherein
an installation position of the power source terminal of the logic-undecided functional block is moved along the periphery of the logic-undecided functional block.

11. The method of designing wiring for power sources in a semiconductor chip according to claim 8, wherein
an installation position of the power source terminal of the logic-undecided functional block is added.

12. The method of designing wiring for power sources in a semiconductor chip according to claim 1, wherein
in determining a power source terminal position of the logic-undecided functional block,
the power source terminal position is determined based on a number for dividing the power source wiring in a vertical direction and a lateral direction of the logic-undecided functional block respectively.

13. The method of designing wiring for power sources in a semiconductor chip according to claim 12, wherein
when a candidate position of the installation of a power source terminal position of the logic-undecided functional block is a corner of the logic-undecided functional block, the power source terminal is installed again at a separate position other than corners on the periphery of the logic-undecided functional block.

14. The method of designing wiring for power sources in a semiconductor chip according to claim 12, wherein
an installation position of the power source terminal of the logic-undecided functional block is moved along the periphery of the logic-undecided functional block.

15. The method of designing wiring for power sources in a semiconductor chip according to claim 12, wherein
an installation position of the power source terminal of the logic-undecided functional block is added.

16. A method of designing wiring for power sources in a semiconductor chip according to claim 1, wherein the information includes an estimated area of one or more cells which is estimated to be installed in the logic-undecided functional block.

17. A method of designing wiring for power sources in a semiconductor chip according to claim 1, wherein the information includes an estimated power consumption which is estimated to be consumed in the logic-undecided functional block.

18. A method of designing wiring for power sources in a semiconductor chip according to claim 1, wherein the information includes an operational voltage which is used in the logic-undecided functional block.

19. A method of designing wiring for power sources in a semiconductor chip comprising:
determining a shape of a logic-undecided functional block;
determining a power source terminal position of the logic-undecided functional block;
installing the logic-undecided functional block on the semiconductor chip;
installing a logic-decided functional block in a space area on the semiconductor chip on which the logic-undecided functional block has not been installed;
providing a provisional wiring of power source between the logic-decided functional block and the logic-undecided functional block installed on the semiconductor chip; and
determining a width of the power source wiring by analyzing a resistor network of the provisionally-provided power source wiring, and rewiring the power source wiring based on the width.

20. The method of designing wiring for power sources in a semiconductor chip according to claim 19, wherein in rewiring the provisional wiring of power source wiring,
a local resistor network of the power source wiring within the logic-undecided functional block is prepared by assuming that current sources have been connected to power source terminals of the logic-undecided functional block,
a resistor network of a total power source wiring is prepared based on this local resistor network, and
the rewiring of the power source wiring is carried out based on the resistor network of the total power source wiring.

21. The method of designing wiring for power sources in a semiconductor chip according to claim 19, wherein
in determining a power source terminal position of the logic-undecided functional block,
the power source terminal position is determined based on basic pitches of the power source terminal position in a vertical direction and a lateral direction of the logic-undecided functional block respectively.

22. The method of designing wiring for power sources in a semiconductor chip according to claim 21, wherein
when a candidate position of the installation of a power source terminal position of the logic-undecided functional block is a corner of the logic-undecided functional block, the power source terminal is installed again at a separate position other than corners on the periphery of the logic-undecided functional block.

23. The method of designing wiring for power sources in a semiconductor chip according to claim 21, wherein
an installation position of the power source terminal of the logic-undecided functional block is moved along the periphery of the logic-undecided functional block.

24. The method of designing wiring for power sources in a semiconductor chip according to claim 21, wherein
an installation position of the power source terminal of the logic-undecided functional block is added.

25. The method of designing wiring for power sources in a semiconductor chip according to claim 19, wherein
in determining a power source terminal position of the logic-undecided functional block,
a width W of power source wiring necessary within the logic-undecided functional block is obtained based on power consumption information obtained from operation frequency, operation rate, power supply voltage used, a number of gates, environmental temperature, and current density of the logic-undecided functional block respectively, in a vertical direction and a lateral direction of the logic-undecided functional block respectively,
a necessary width of the power source wiring is obtained based on this W and a basic width of the power source wiring, and
the power source terminal position is determined based on the width of the power source wiring.

26. The method of designing wiring for power sources in a semiconductor chip according to claim 25, wherein
when a candidate position of the installation of a power source terminal position of the logic-undecided functional block is a corner of the logic-undecided functional block, the power source terminal is installed again at a separate position other than corners on the periphery of the logic-undecided functional block.

27. The method of designing wiring for power sources in a semiconductor chip according to claim 25, wherein
an installation position of the power source terminal of the logic-undecided functional block is moved along the periphery of the logic-undecided functional block.

28. The method of designing wiring for power sources in a semiconductor chip according to claim 25, wherein
an installation position of the power source terminal of the logic-undecided functional block is added.

29. The method of designing wiring for power sources in a semiconductor chip according to claim 19, wherein
in determining a power source terminal position of the logic-undecided functional block,
the power source terminal position is determined based on a number for dividing the power source wiring in a vertical direction and a lateral direction of the logic-undecided functional block respectively.

30. The method of designing wiring for power sources in a semiconductor chip according to claim 29, wherein
when a candidate position of the installation of a power source terminal position of the logic-undecided functional block is a corner of the logic-undecided functional block, the power source terminal is installed again at a separate position other than corners on the periphery of the logic-undecided functional block.

31. The method of designing wiring for power sources in a semiconductor chip according to claim 29, wherein
an installation position of the power source terminal of the logic-undecided functional block is moved along the periphery of the logic-undecided functional block.

32. The method of designing wiring for power sources in a semiconductor chip according to claim 29, wherein
an installation position of the power source terminal of the logic-undecided functional block is added.

33. A computer-readable recording medium recorded with a program for making a computer execute a method of designing wiring for power sources in a semiconductor chip, the program comprising:
obtaining information necessary for determining an area of a logic-undecided functional block;
determining the area of the logic-undecided functional block based on the obtained information;
installing a logic-decided functional block on the semiconductor chip;
determining a shape of the logic-undecided functional block, to match a space area of the semiconductor chip on which the logic-decided functional block has been installed;
determining a power source terminal position of the logic-undecided functional block;
installing the logic-undecided functional block in a space area on the semiconductor chip;
providing a provisional wiring of power source between the logic-decided functional block and the logic-undecided functional block installed on the semiconductor chip; and
determining a width of the power source wiring by analyzing a resistor network of the provisionally-provided power source wiring, and rewiring the power source wiring based on the width.

34. A computer-readable recording medium recorded with a program for making a computer execute a method of designing wiring for power sources in a semiconductor chip, the program comprising:
determining a shape of a logic-undecided functional block;
determining a power source terminal position of the logic-undecided functional block;
installing the logic-undecided functional block on a semiconductor chip;
installing a logic-decided functional block in a space area on the semiconductor chip on which the logic-undecided functional block has not been installed;
providing a provisional wiring of power source between the logic-decided functional block and the logic-undecided functional block installed on the semiconductor chip; and
determining a width of the power source wiring by analyzing a resistor network of the provisionally-provided
power source wiring, and rewiring the power source wiring based on the width.

35. A method of designing wiring for power sources in a semiconductor chip comprising:
determining an area of the logic-undecided functional block based on an estimated area of a cell and estimated power consumption of the logic-undecided block;
determining a shape of the logic-undecided functional block, to match a space area of the semiconductor chip on which a logic-decided functional block has been installed;
installing the logic-undecided functional block on the semiconductor chip;
providing a provisional wiring of a power source between the logic-decided functional block and the logic-undecided functional block; and
determining a width of the power source wiring by analyzing a resistor network of the provisional wiring, and rewiring the power source wiring based on the determined width.

36. A computer-readable recording medium recorded with a program for making a computer execute a method of designing wiring for power sources in a semiconductor chip, the program comprising:

determining an area of the logic-undecided functional block based on an estimated area of a cell and estimated power consumption of the logic-undecided block;

determining a shape of the logic-undecided functional block, to match a space area of the semiconductor chip on which a logic-decided functional block has been installed;

installing the logic-undecided functional block on the semiconductor chip;

providing a provisional wiring of a power source between the logic-decided functional block and the logic-undecided functional block; and determining a width of the power source wiring by analyzing a resistor network of the provisional wiring, and rewiring the power source wiring based on the determined width.

* * * * *